United States Patent [19]
Kikinis

[11] Patent Number: 5,861,873
[45] Date of Patent: *Jan. 19, 1999

[54] MODULAR PORTABLE COMPUTER WITH REMOVABLE POINTER DEVICE

[75] Inventor: Dan Kikinis, Saratoga, Calif.

[73] Assignee: Elonex I.P. Holdings, Ltd., London, England

[*] Notice: The term of this patent shall not extend beyond the expiration date of Pat. No. 5,278,730.

[21] Appl. No.: 335,324

[22] Filed: Nov. 7, 1994

Related U.S. Application Data

[63] Continuation-in-part of Ser. No. 209,539, Mar. 11, 1994, abandoned, and Ser. No. 159,078, Nov. 29, 1993, Pat. No. 5,539,616, which is a continuation-in-part of Ser. No. 97,946, Jul. 26, 1993, Pat. No. 5,278,730, which is a continuation of Ser. No. 905,480, Jun. 29, 1992, abandoned.

[51] Int. Cl.⁶ ..................................................... G09G 3/02
[52] U.S. Cl. ......................... 345/157; 345/905; 345/903; 361/686
[58] Field of Search ..................................... 345/157, 156, 345/168, 169, 173, 903, 905; 361/686, 681, 683, 726, 727; 364/708.1; 439/988

[56] References Cited

U.S. PATENT DOCUMENTS

| | | | |
|---|---|---|---|
| 5,049,863 | 9/1991 | Oka | 345/168 |
| 5,193,051 | 3/1993 | Ma | 361/681 |
| 5,227,957 | 7/1993 | Deter | 361/683 |

*Primary Examiner*—Kee M. Tung
*Assistant Examiner*—Doon Chow
*Attorney, Agent, or Firm*—Donald R. Boys

[57] ABSTRACT

A modular computer has a framework with module bays for receiving CPU modules, power modules, and peripheral function modules such as floppy and hard disk drives. The framework has a built-in compressed bus and a variety of function modules which can be plugged into any one of the module bays. Function modules include, but are not limited to, CPU, power, floppy disk, hard disk, RAM memory, LAN communication, modem, FAX communication, and data acquisition. In some embodiments function modules are provided for communicating with separate input means, such as voice, keyboards, and pen-pads. In one aspect the module bays and the function modules are configured according to dimensional and connective standards of the Personal Computer Memory Card International Association. There are additionally pointer devices configured to be stored in compartments in the modular computer.

32 Claims, 36 Drawing Sheets

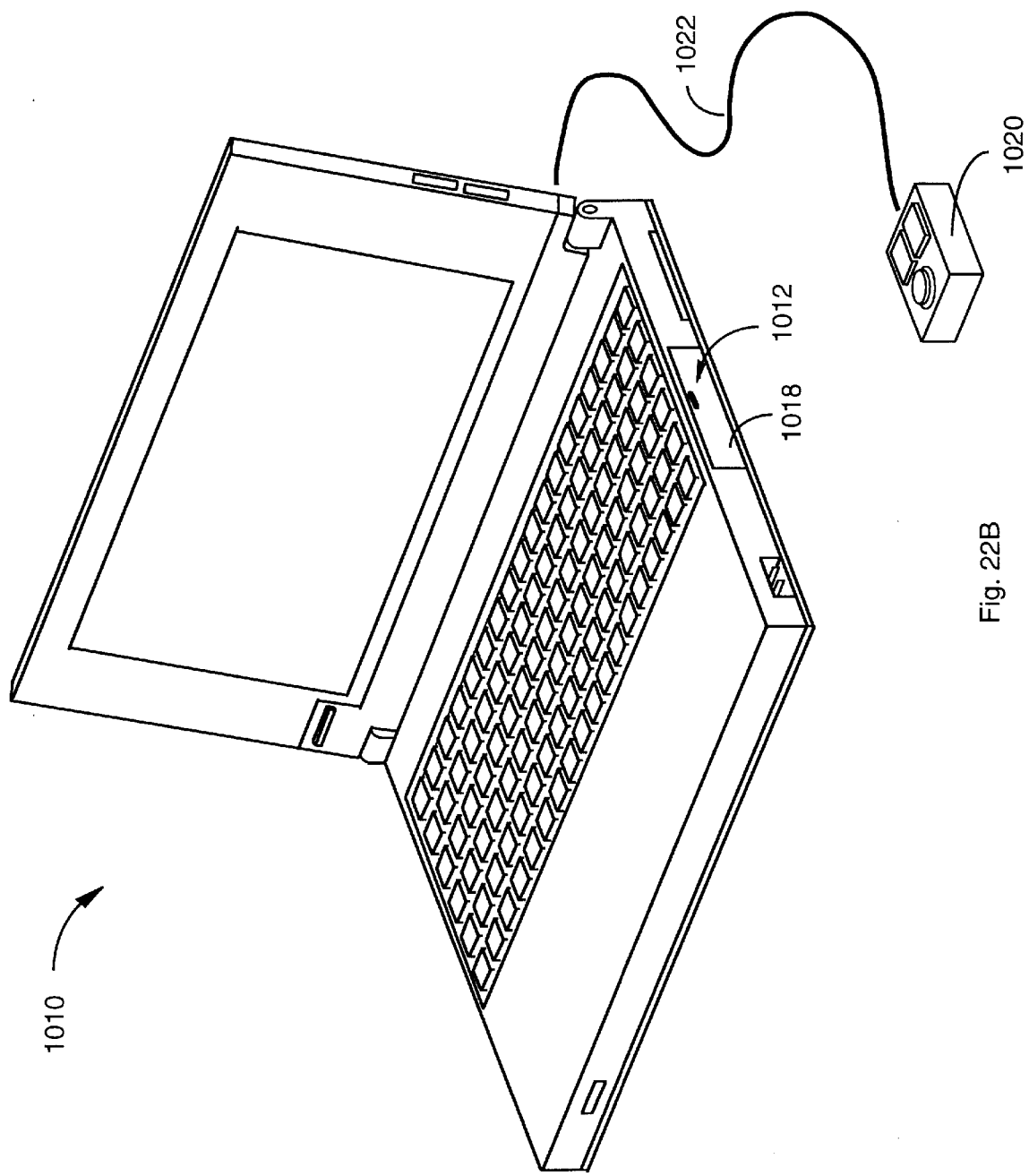

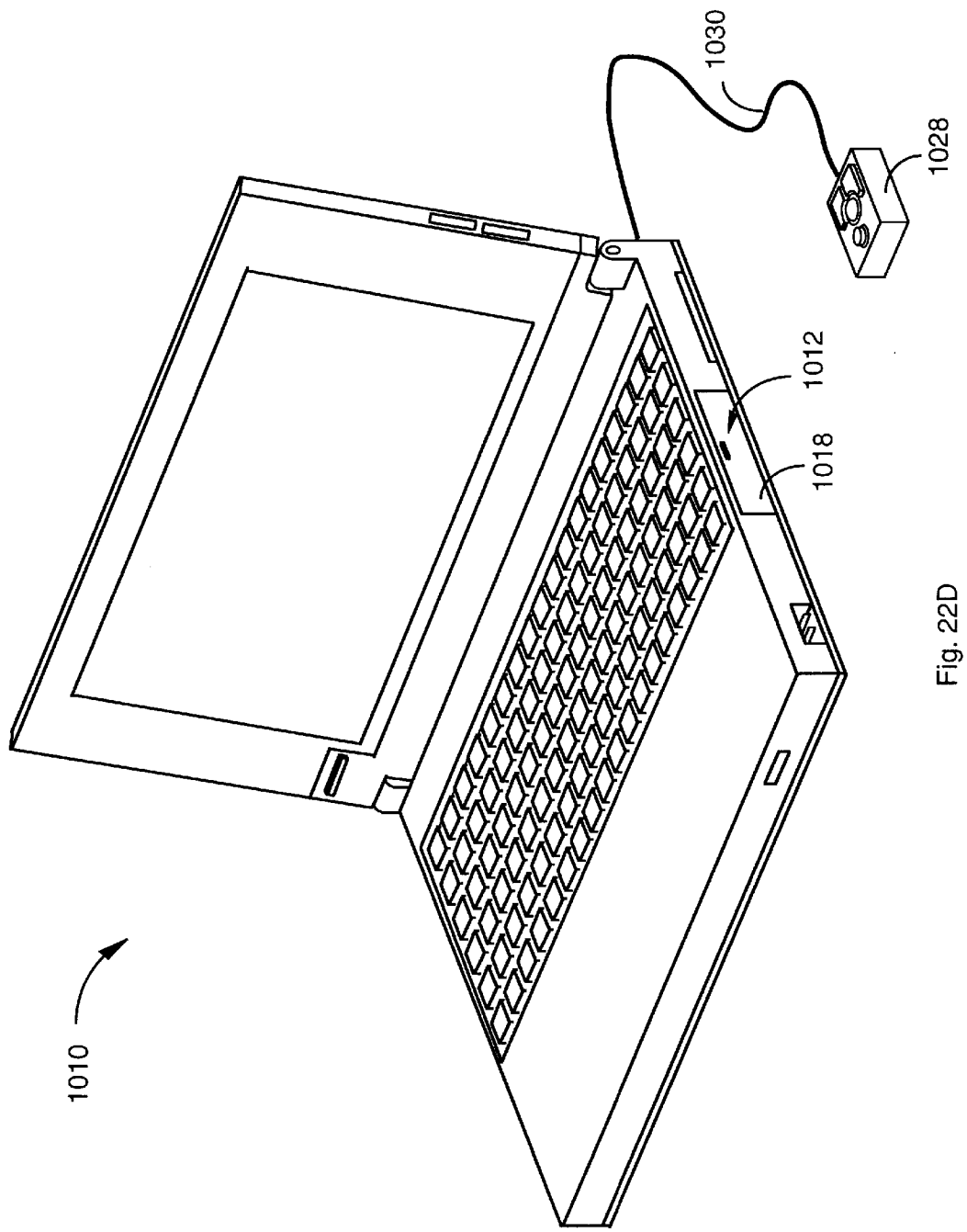

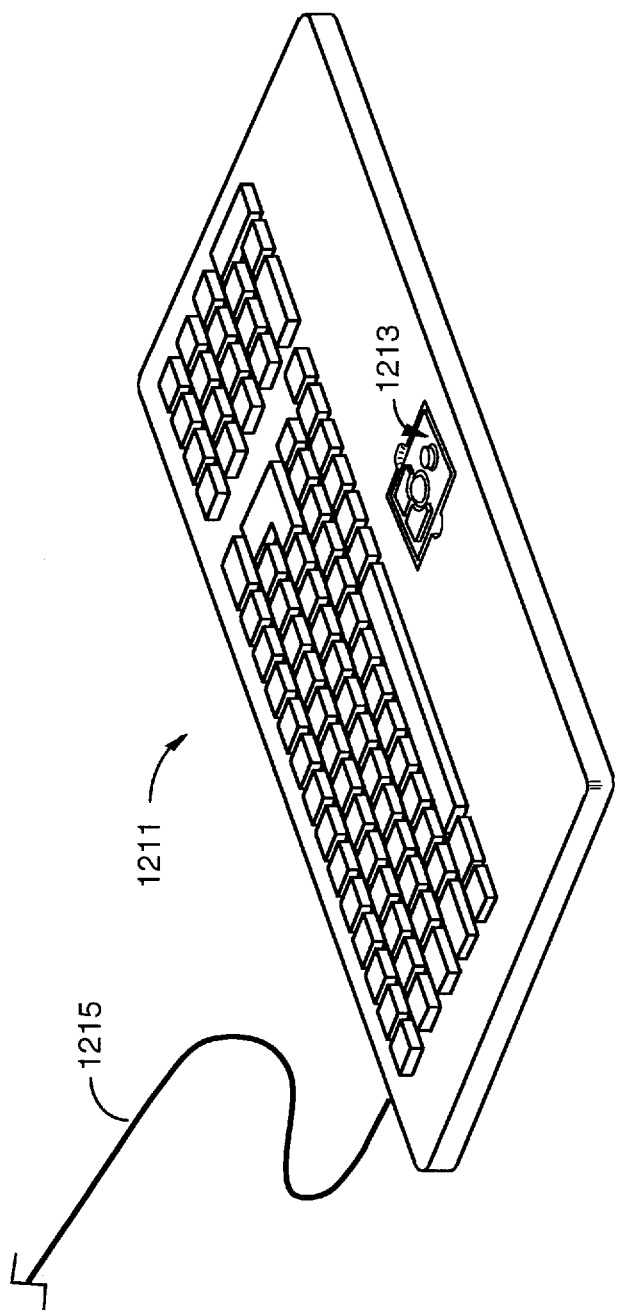

MODULAR PORTABLE COMPUTER WITH REMOVABLE POINTER DEVICE

CROSS REFERENCE TO RELATED DOCUMENTS

This application is a continuation-in-part of pending application Ser. No. 08/159,078, filed Nov. 27, 1983 now U.S. Pat. No. 5,539,616, which is a continuation-in-part of application Ser. No. 08/097,946 filed Jul. 26, 1993, now U.S. Pat. No. 5,278,730, which is a continuation of application Ser. No. 07/905,480, filed Jun. 29, 1992, abandoned. This application is also a continuation-in-part of pending application Ser. No. 08/209,539, filed Mar. 11, 1994, now abandoned. This application is also related to patent application Ser. No. 08/154,755, which is a division of Ser. No. 08/097,946 issued as U.S. Pat. No. 5,278,730. Ser. No. 08/154,755 has issued as U.S. Pat. No. 5,331,509 on Jul. 19, 1994.

FIELD OF THE INVENTION

The present invention is in the area of portable computer systems, and is particularly relevant to portable computers known as notebook, subnotebook, and palmtop computers, and to pointer devices used with such computers.

BACKGROUND OF THE INVENTION

Portable computers are popular among computer users who travel and need to take their work along, and there is a tendency in the marketplace to smaller and smaller versions of portable computers. They are smaller and lighter than laptops, and are therefore more portable. The evolution to smaller and lighter portable computers, however, is not without problems. For one thing, smaller portable computers means less space for battery packs, which usually means shorter useful life between recharges. Another problem related to smaller size is a difficulty in providing versatility. Smaller size naturally means less space to provide a broad choice in peripheral devices and options.

Yet another problem is related to addresses and data byte size. State-of-the-art computers are capable of 32 bit addresses and 32 bit data words. A 32 bit computer, though, typically needs a bus structure with nearly 100 active signals, equating to high pin count and extensive device and component density. Such high density in a small computer creates many other problems, such as problems with heat dissipation.

Still another problem related to the small size of such computers is the incorporation of pointer devices for such as cursor control and menu selection. These are a few of the many problems in designing and developing portable computers.

What is needed is a new design for portable computers based on a bus structure allowing 32-bit capability with a minimum pin count, utilizing, for example, multiplexing of address and data on a single 32 bit structure, and utilizing only state-of-the-art technology to minimize power (hence buffer) requirements, which also minimizes heat and equipment complexity and density problems. Also, modularity needs to be raised to a new level by making virtually all components modular and "plug-in", including CPUs, power packs, and all of the various known sorts of peripheral devices. Removable pointer devices for such small and modular computers is another serious need.

SUMMARY OF THE INVENTION

In an embodiment of the present invention a modular computer is provided comprising a support structure for supporting and enclosing elements of the modular computer, a plurality of module bays configured in a common plane, the module bays opening to at least one edge of the support structure and configured to dock functional modules, a first multi-pin electrical connector at the inboard end of each module bay for engaging a second electrical connector of a functional module, and an internal bus connected to each of the electrical connectors in the module bays. There is also a display and a substantially planar input means for providing user input to the modular computer, the input means attached to the support structure substantially coplanar with and overlying the plane of the module bays. Each module bay in one embodiment comprises a guide means for guiding a module in docking operations, a retaining means for holding a module when docked, and a user-operable expulsion means for disengaging a docked module. In a preferred embodiment the module bays are configured for docking functional modules according to one of Personal Computer Memory Card International Association standards Type I, Type II, and Type III.

In various embodiments of modular computers according to the invention, removable pointer devices are provided in a manner allowing the pointer to be removed and deployed away from the computer for operation.

In another embodiment the input means is a keyboard, and the display is a flat panel display hinged to the support structure, and closable over the keyboard for storage and transport.

Functional modules are provided serving a wide variety of functions. One module comprises a CPU, which provides flexibility in CPU type and power, and upgradability as well. A CPU module may also incorporate random access memory and video display control. Function modules also are provided to enhance flexibility in input. Separate input devices, such as a full-size keyboard or a pen-based input tablet may be used with appropriate modules for receiving signals from the separate input devices and providing the signals to the internal bus. An input module for voice input, recognizing human speech, is also provided. Other function modules include Fax modems, telephone modems, floppy drives, hard disk drives, LAN communication modules, and data acquisition modules.

BRIEF DESCRIPTION OF THE DRAWINGS

FIG. 22B is an isometric view of the notebook-type computer of FIG. 22A with a mouse pointer device deployed for use, having a connecting cable.

FIG. 22D is an isometric view of a notebook-type computer with a cord-connected trackball device deployed for use.

FIG. 29 is an isometric view of a keyboard having a removable pointer device according to a preferred embodiment of the present invention.

DESCRIPTION OF THE PREFERRED EMBODIMENTS

General Description

Figure 1A:
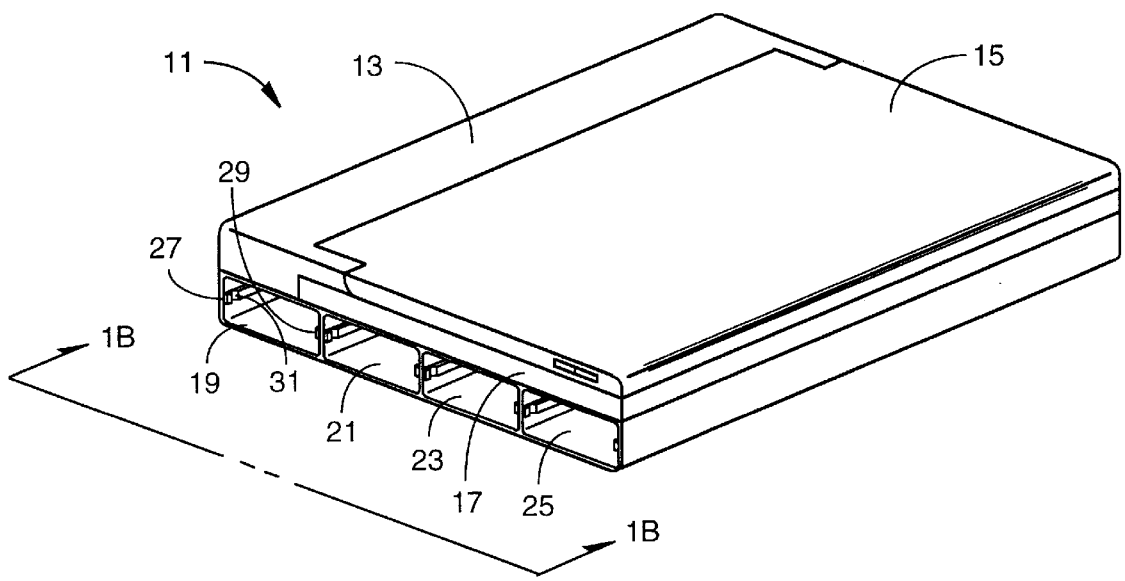
FIG. 1A is an isometric view of a modular notebook computer framework according to an embodiment of the present invention.

FIG. 1A is an isometric drawing of a notebook computer framework 11 according to the invention. Framework 11 comprises a back housing 13, a tilt-up flat panel display 15, shown closed, a keyboard 17, and a plurality of module bays for plugging in function modules. Back housing 13 includes a power unit for converting electrical input on a wide variety of standards to the form required by the computer. For example, there is a port (not shown) for connecting to a standard household outlet, rated at 120 V., 60 Hz, alternating current. The power unit will convert the input to outputs as needed by the computer bus and functional modules. There are also input ports for 6 V. DC, 12 V. DC, 9 V. DC, and others, and the power unit in one embodiment of the present invention is capable of recognizing the input characteristics by sampling, and switching to proper on-board circuitry to utilize the input.

In the embodiment shown by FIG. 1A four module bays 19, 21, 23, and 25 are shown along one side of the framework. There are four more module bays along the other side of the framework opposite the module bays shown. There could be more or fewer module bays, but eight is convenient and a good balance between the need to stay small and simple, and to also have adequate versatility.

Figure 1B:
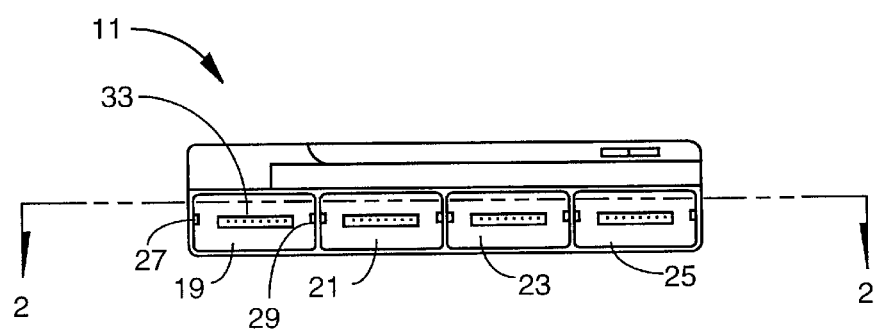
FIG. 1B is a view of the computer framework of FIG. 1A from one side from the vantage of line 1B—1B on FIG. 1A.

FIG. 1B is an end view of the notebook computer framework of FIG. 1 in the direction of arrows 1B—1B of FIG. 1A. Each of the module bays has a set of guide and positioning rails such as rails 27 and 29 in bay 19. The rails are to position and guide a function module inserted into the module bay. Each rail in a set has a detent such as detent 31 for latching a module when the module is fully inserted in the bay. Each bay also has a connector such as connector 33 in bay 19. The connectors are for coupling to a mating connector on a function module inserted in a bay. It will be apparent to a person with skill in the art that there are a number of equivalent ways guide rails, detents, and coupling may be accomplished.

Figure 2:
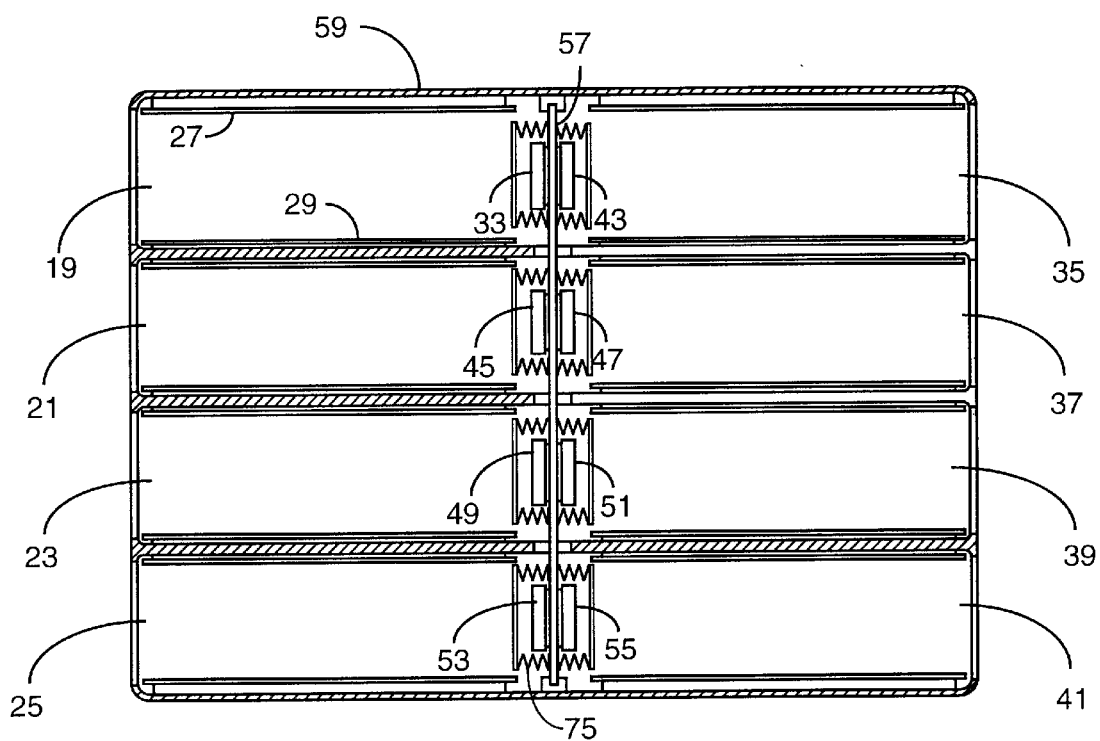
FIG. 2 is a sectioned plan view of the computer framework of FIG. 1A taken according to section line 2—2 of FIG. 1B.

FIG. 2 is a plan section view just above the module bays taken along section line 2—2 of FIG. 1B. Bays 19, 21, 23, and 25 are shown on one side of the section view, and bays 35, 37, 39, and 41 along the opposite side. A printed circuit board structure 57 is fastened in a substantially vertical position down the center of frame 59, and connectors 33, 43, 45, 47, 49, 51, 53, and 55 are connected to the printed circuit board structure and present their pin structure outward toward the respective bay areas. In the presently described embodiment the internal connectors are male connectors, but this is not a requirement of the invention.

As also shown in FIG. 1A, each module bay has a pair of opposed rails located vertically at about the midpoint of the height of the module bay. Rails 27 and 29 serve module bay 19, and similar rails are located in each of the other module bays.

Figure 3:
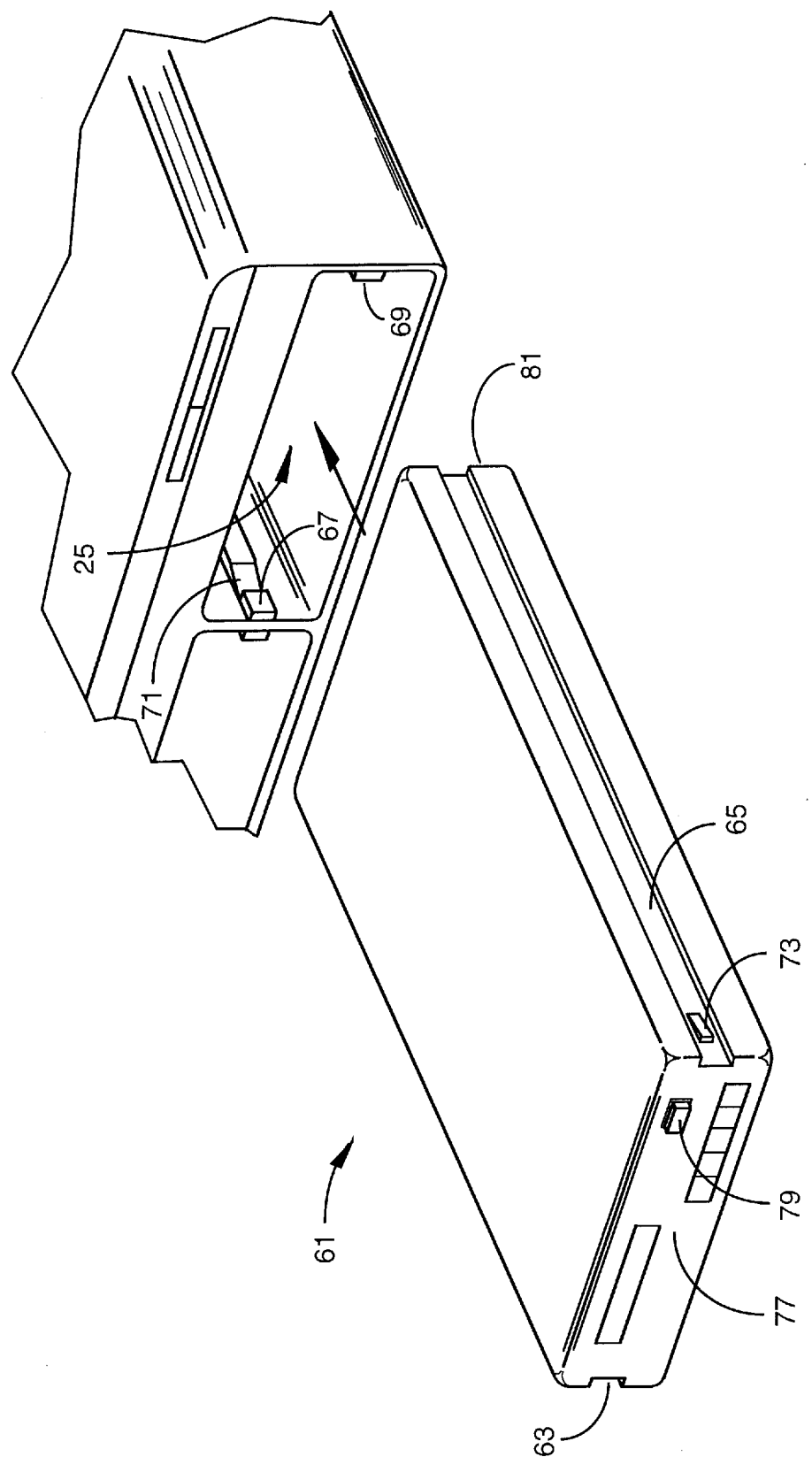
FIG. 3 is an isometric illustration showing a function module according to the present invention associated with a docking bay of the framework of FIG. 1A.

FIG. 3 is an isometric view of a function module 61 according to the invention aligned with module bay 25 of framework 11. Module 61 includes guides 63 and 65 on opposite sides for engaging rails 67 and 69 when module 61 is inserted into bay 25. The module has two spring-loaded detent levers (lever 73 is shown) for engaging detents in guide rails 67 and 69 when the module is fully inserted. Detent 71 is shown in rail 67 in FIG. 3.

Each module bay has a compression spring mechanism engaged by a function module as the module nears full insertion, so there is an outward force on the module when the detent levers engage the detents. Mechanism 75 (FIG. 2) is exemplary. To insert a module one aligns the guides in the module with the guide rails and pushes the module into the module bay until the detents engage. Button 79 on front face 77 of the module is for retracting the detent levers of the module, in which case the spring mechanism ejects the module, much as is the case with some floppy disk drives.

Figure 4:
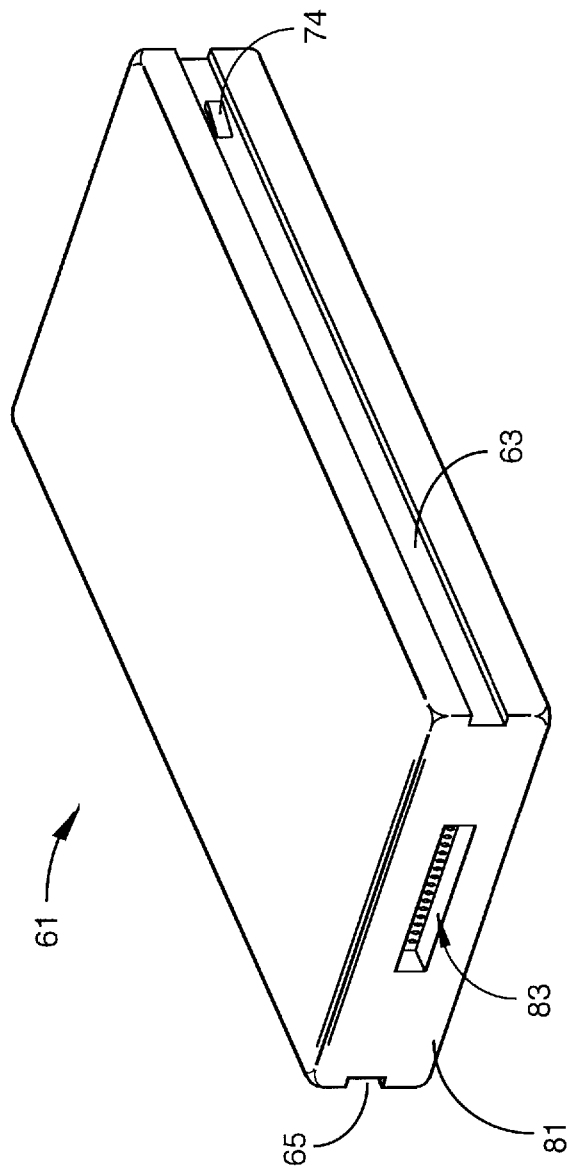
FIG. 4 is another view of a function module according to the present invention.

FIG. 4 is an isometric view of function module 61, showing back face 81 opposite front face 77. The back face includes a recessed female connector receptacle 83 in the preferred embodiment, for mating with male connectors positioned in each pod bay, such as connector 33 in FIG. 1B and FIG. 2. A second detent lever 74 is opposite lever 73 of FIG. 3.

In the embodiment described above, and in many other embodiments, the notebook computer framework of the present invention comprises a frame with module bays and connectors as described above for "plugging in" function modules, power supply units, and other peripheral devices. The framework also comprises display 15, keyboard 17, and an internal bus structure hereinafter termed the Notebus, which is described in additional detail below, in the section titled "Notebus Bus Structure".

The function modules, as represented by module 61 in FIG. 3 and FIG. 4, are provided in a wide variety of different models capable of a wide variety of different functions. For example, framework 11 has no "on-board" CPU, battery power, or system memory. These functions and all other functions are provided by different models of function modules which may be inserted in any one or a combination of the available module bays. Other kinds of function modules that may be inserted include floppy-disk drives, hard-disk drives, "flashcard" memory modules, LAN and modem adapters, Fax modules, specialty modules such as data acquisition modules adapted to specific equipment, and more. The function modules are also described in more detail in the section below titled "Function Modules".

Electronic Architecture

Figure 5:
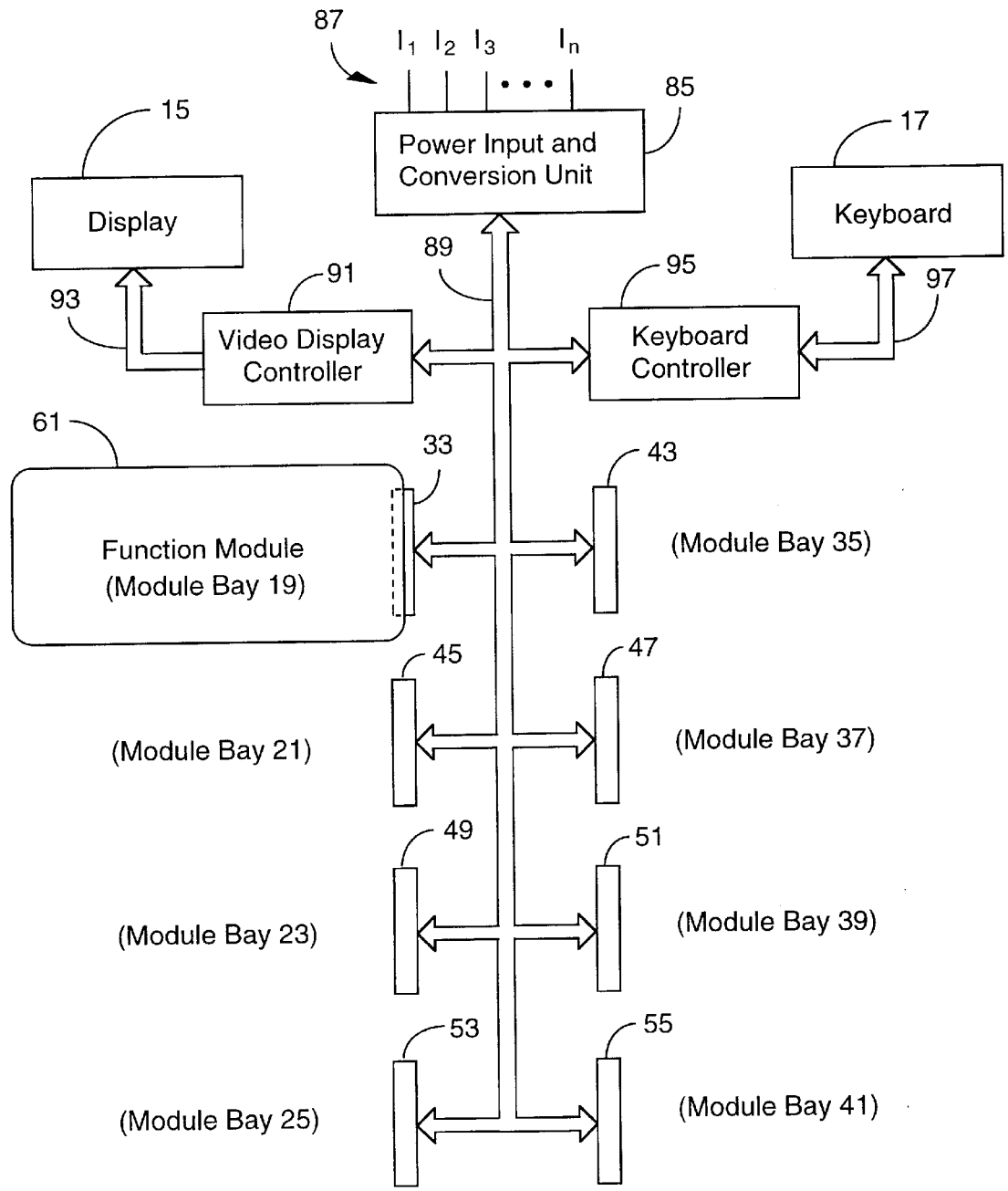
FIG. 5 is a block diagram of a compressed bus and connection to docking bays in a computer framework according to an embodiment of the present invention.

FIG. 5 is a block diagram showing internal elements of Notebook computer framework 11, connected to show the electronic architecture of the notebook computer according to the invention. Power input and conversion unit 85 is housed in back housing 13 (FIG. 1) and has ports 87 for power inputs. Unit 85 senses the input conditions and selects appropriate circuitry to convert the input to the voltages needed to power the other elements of the system. Output from the conversion unit is to Notebus 89, which comprises paths for power as well as for digital information such as data and addresses.

Because there are a wide variety of function modules, as indicated above and described in more detail below, there needs typically to be more than one power line in the Notebus. For example, the notebook computer of the invention comprises hard disk drive modules, and these modules are preferably provided without their own "on board" power source. The motor drive for the hard disk requires a different power (voltage and current) than does a CPU, for example, so there are parallel power lines of differing size and voltage level in the notebus. A typical Notebus will have, for example, a line for 24 V DC, another for 12 V DC, and yet another for 5 V DC, as well as multiple ground lines.

Notebus 89 connects to a video display controller 91 including Video Random Access Memory (VRAM) which both powers and controls display 15, which in the preferred embodiment is a flat panel display driven by analog driver lines on analog bus 93. Notebus 89 also connects to a keyboard controller 95 which powers and controls keyboard 17 over link 97, accepting keystroke input and converting the input to digital data for transmission on Notebus 89. The keyboard controller may be physically mounted in the keyboard or in framework 11.

Notebus 89 also connects as illustrated in FIG. 5 to each of the module bays, such as bay 19, through connectors, such as connector 33. When a function module, such as module 61, is inserted into a module bay, the mating connector in the back of the function module mates with the connector from the Notebus, and circuitry inside the function module is then connected to the Notebus.

Notebus Bus Structure

The Notebus comprises, as stated above, both power and data paths. The digital lines are capable of carrying 32 addresses and conveying data in 32 bit word length. To minimize pin count and routing complexity, addresses and data are multiplexed on a single set of 32 traces in the overall bus structure. One with skill in the art will recognize that this type of bus is what is known in the art as a low-pin-count or compressed bus. In this kind of bus different types of signals, such as address and data signals, share signal paths through multiplexing. For example, the same set of data lines are used to carry both 32-bit addresses and data words of 32-bit length.

In the Notebus of the present invention, some control signals, such as interrupt arbitration signals, may also share the data lines. Typical examples of buses that are exemplary as usable for the Notebus (with the exception of power supply analog lines in the Notebus) are the "S-Bus" implemented by Sun Microsystems, the "Turbochannel" Bus from Digital Equipment Corporation, and buses compatible with the IEEE-488 standard.

The Notebus is a high-speed backplane bus for interconnecting processor, memory and peripheral device modules. The Notebus also supplies standard operating and standby power supply voltages and electrical ground to all module bays.

Function Modules

FIG. 3 and FIG. 4 show, as described above, two different views of a function module according to the present invention. Also as stated above, function modules may have many different functions. There are as many different functions, in fact, as there are possibilities for discrete peripheral devices, plus power and CPU modules. An individual function module is provided for each function, and in each case the function module has a physical size and form compatible with the bays, guide rails, and connectors for "plugging in" to framework 11.

The "face" of a function module, being the exposed face when the module is "plugged in" (see face 77 in FIG. 3) may have elements specific to the type of module. For example, a CPU module may have no indicators or other elements on the front face, while a floppy disc module will typically have an opening for inserting a floppy disk and a "key" or button for releasing and ejecting the floppy disk.

A unique feature of the present invention is that the CPU for the notebook computer is provided as a CPU function module. This provides an ability for a user to tailor the CPU power to the other modules and application for the notebook computer, and an easy upgrade to more powerful CPUs.

Figure 6:
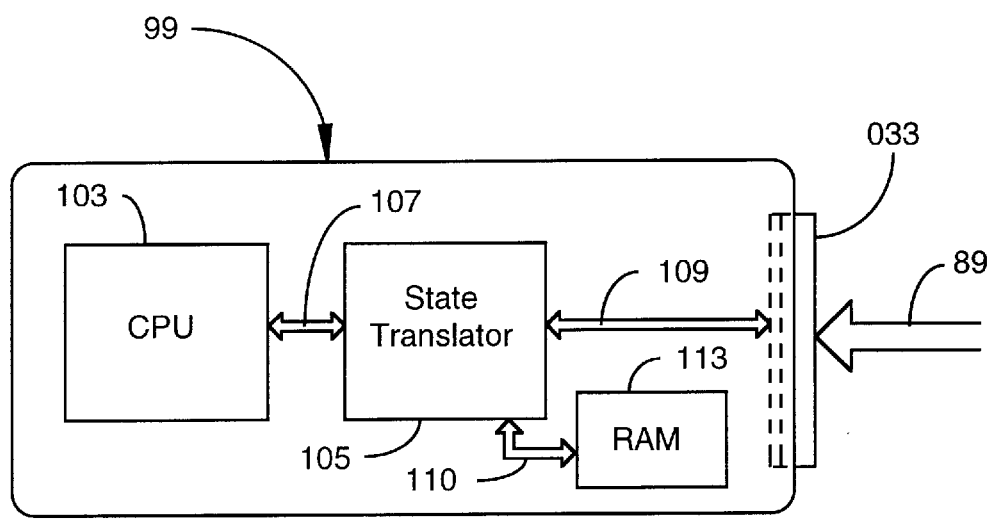
FIG. 6 is a block diagram of a CPU function module according to an embodiment of the present invention.

FIG. 6 is a diagram of a CPU module 99 plugged into a bay in a notebook computer according to the present invention. In this case (referring to FIG. 2) the module is plugged into bay 19 having connector 33. This is exemplary, as the module could just as well be plugged into any open bay of framework 11. By virtue of being plugged into connector 33 or another module connector, internal elements of the CPU module are connected to Notebus 89.

The internal elements for module 99 comprise CPU 103, a state translator 105, and RAM memory 113. CPU 103 may be any of a wide variety of CPUs (also called in some cases MPUs) available in the art, for example Intel 80386 or 80486 models, MIPS, RISC implementations, and many others. CPU 103 communicates with State Translator 105 over paths 107, and State Translator 105 communicates with connector 33, hence Notebus 89, over bus 109 internal to the module, which is an extension of bus 89 when the module is plugged into bus 89.

State translator 105 is a chip or chip set designed to translate commands and requests of the CPU to commands and requests compatible with the Notebus. It was mentioned above that CPU 103 may be one of a wide variety of CPUs, and that Notebus 89 may be any one of a wide variety of compressed buses. It will be apparent to one with skill in the art that there may be an even wider variety of state translators 105 for translating between the CPU and the Notebus. The state translator is theoretically a different device for each possible combination of CPU and Notebus.

RAM memory module 113 comprises conventional RAM chips mounted on a PCB as is known in the art, and connectable to state translator 105 by a plug or connector interface, such as an edge connector. The purpose of having a RAM module "on board" the CPU module is to provide for rapid memory access, which will be much slower if the RAM is made available in a separate module at one of the other module bays. Memory at another module bay is on the Notebus, and will be subject to bus contention and wait states. The plug-in nature of the RAM unit relative to the CPU module allows different amounts of memory to be provided with a CPU module in the notebook computer of the present invention.

As described above, Notebus 89 comprises not only the shared data and address lines, but also power and ground connections for the modules plugged into the various bays. Paths 109 and 107 therefore comprise power and ground lines for CPU 103 and Translator 105.

If, for example, CPU 103 is an INTEL 80486 microprocessor, State Translator 105 will be a translator for accommodating the state machine of the 80486 to the state machine of the Notebus, which may be any one of the buses described above for bus 89, or another compressed bus. There are many equivalent ways a translator may be implemented for the specific case. Given the manufacturers available design information for the CPU and the equivalent information for bus 89, it is within the skill of workers in the art without undue experimentation to implement the translator and the required connections. This is conventional technology. The implementation of the translator on a module with a CPU to plug into a module bay in the notebook computer is unique to the present invention.

In the invention, state translators may be implemented in a single chip set or circuitry set to be capable of translating between a number of CPUs and a number of different bus possibilities. One might, for example, design and implement a translator with the necessary circuitry and intelligence to translate between three different CPUs and three different compressed buses. The state translator could be made hardware or software programmable to select one CPU and one bus from the available selections at some convenient time in the manufacturing cycle, or even at the time of selection of modules to make up a notebook computer.

As an example of a hardware programmable translator, a translator could be built to have certain traces cut as a near final step in manufacture as a way of selecting the CPU and bus pair. Translators could also be programmable by virtue of on-board EPROM or EEPROM devices. As an example of software programmability, translators could be implemented with microprocessor technology and software programmable. A CPU module could be plugged into a connector on a special programming unit, for example, before installation in a notebook computer according to the present invention, and be sent certain commands to set up on board software to translate between the desired CPU and bus. It will be apparent to one with skill in the art that there are many possible variations in the implementation of the translators.

Figure 7:
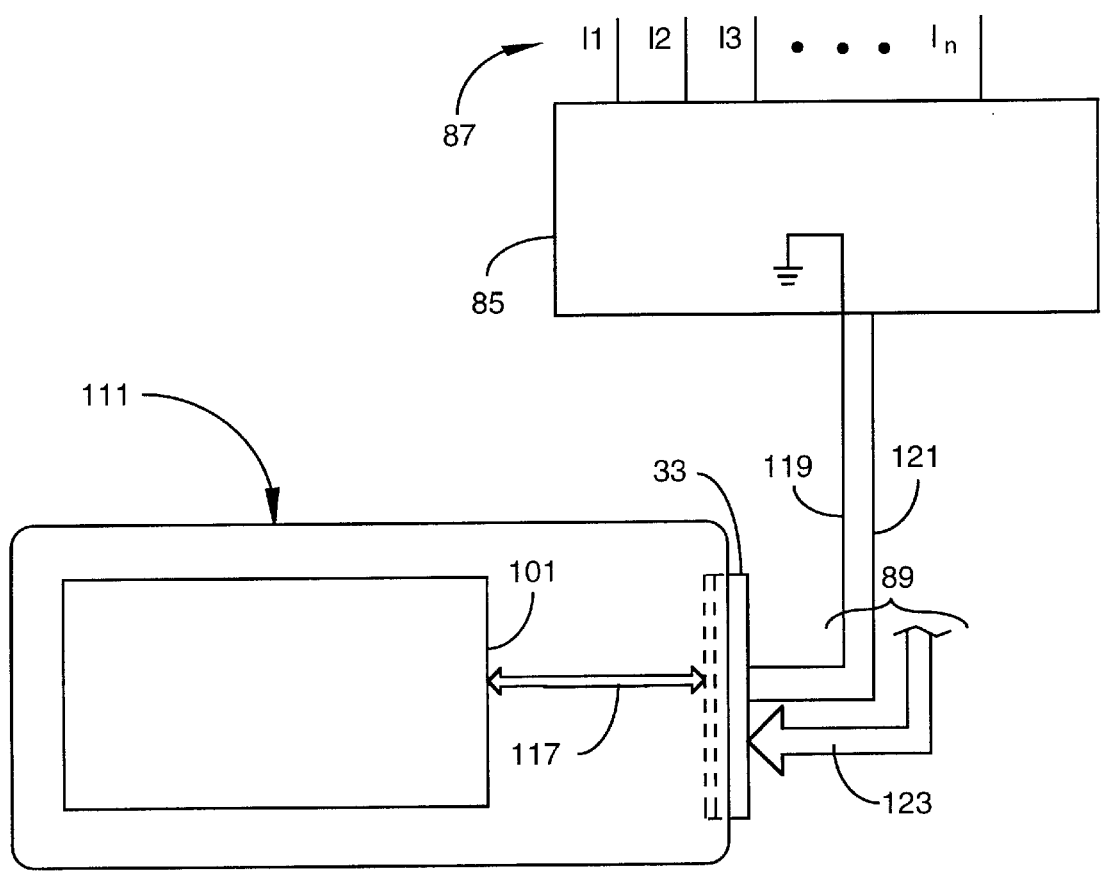
FIG. 7 is a block diagram of a power supply function module according to an embodiment of the present invention, with indication of connections to the internal bus structure and power conversion unit of the computer.

FIG. 7 shows a power module 111 plugged into a bay in the notebook computer according to an embodiment of the present invention. The purpose of a power module is to provide a source of power for the computer, which includes any modules plugged into the module bays. As is common in notebook computers in the art, there may be a battery, typically rechargeable, in framework 11, and the battery may also be replaceable and rechargeable through power input lines 87. In the case of an on-board battery pack, there is the option of using all module bays for other than power packs.

Preferably framework 11, sans function modules, has no power capability other than power plugged into one of input lines 87, which may be converted to the power characteristics needed by the computer and distributed on the power lines of the Notebus. For portability, power is typically supplied by one (or more) power modules 111 plugged into one or more of the module bays.

Module 111 has a battery pack 101 which is connected via lines 117 to (in this case for example) connector 33, and hence to Notebus 89. Because there are several supply lines in the Notebus for supplying power to function modules at different voltage and with different current capability, the power lines in the Notebus for connecting a power module 111 are not the same as the lines for supplying power to a module. There is instead a separate sat of power lines to pins on the module bay connectors, such as connector 33, which connect as input to power input and conversion unit 85, much as do input ports 87.

In FIG. 7, lines 119 and 121 connect power module 11 to conversion unit 85, where the power input from the power module is sensed and treated as a power source, much as is done for power input lines 87. This power is converted to the needed voltages and current capabilities, and put back out on the power supply output lines to the module bays. In FIG. 7 line 119 is ground, and arrow 123 represents all of the data/address, control, and power output lines to the module bays. Lines represented by arrow 123, plus lines 119 and 121 are Notebus 89. Although not shown in FIG. 7, there are connections for line 119 and for line 121 to each of the module bay connectors.

Power modules such as module 111 may be plugged into a connector on a charging module separate from the notebook computer, using the same connector used for plugging into the Notebus via a module bay of framework 11, and recharged for later use with a modular notebook computer according to the invention. This allows a user to keep spare power modules ready for use, and to recharge modules without connecting the computer itself to a charging unit. Moreover, the provision of power modules allows a user to provide more or less portable time to the notebook computer by using one or more than one power module.

Figure 8:
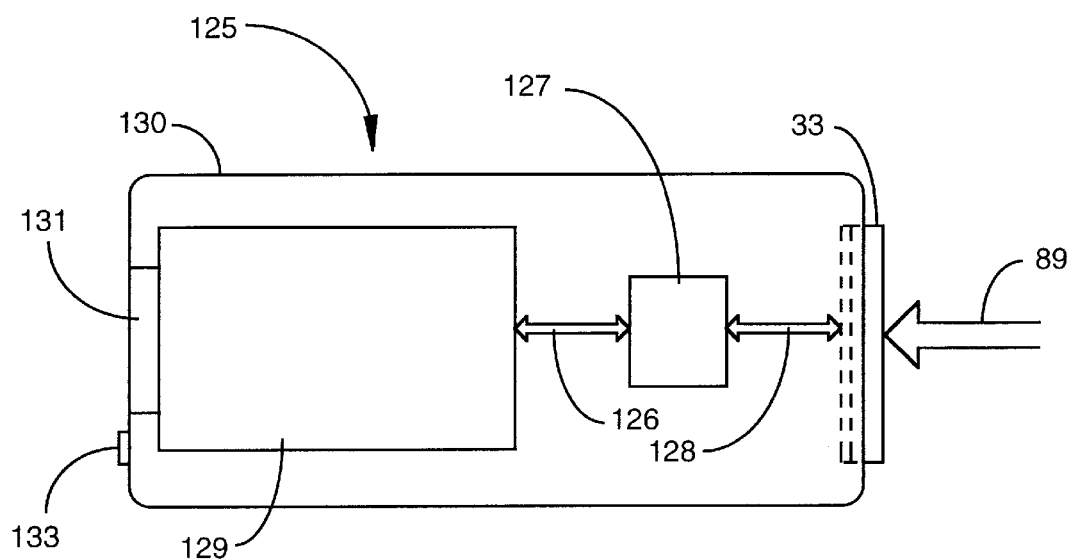
FIG. 8 is a block diagram of a floppy disk drive function module used in the invention.

FIG. 8 shows a floppy disk drive (FDD) module 125 plugged into a module bay in a notebook computer according to an embodiment of the present invention. Module 125 comprises a conventional FDD unit 129 for nominal 3.5 inch disks with conventional circuitry mounted in a case 130 to provide a module with guides, latches, and a connector matable with connector 35 to be able to plug into a module bay in the notebook computer of the present invention. The case comprises an opening 131 for inserting and withdrawing a floppy disk, and an eject button 133 for ejecting a floppy disk.

A controller 127 communicates with unit 129 over lines 126 and with connector 33 (hence Notebus 89) over lines 128. The unit also derives power from the appropriate pins on connector 33, but these pins and lines are not shown. Controller 127 is an ASIC chip or chip set for translating between the notebus and the FDD unit. Given the data storage standards of the FDD unit and the characteristics of bus 89, it is within the scope of workers with ordinary skill in the art to implement controller 127 without undo experimentation.

Figure 9:
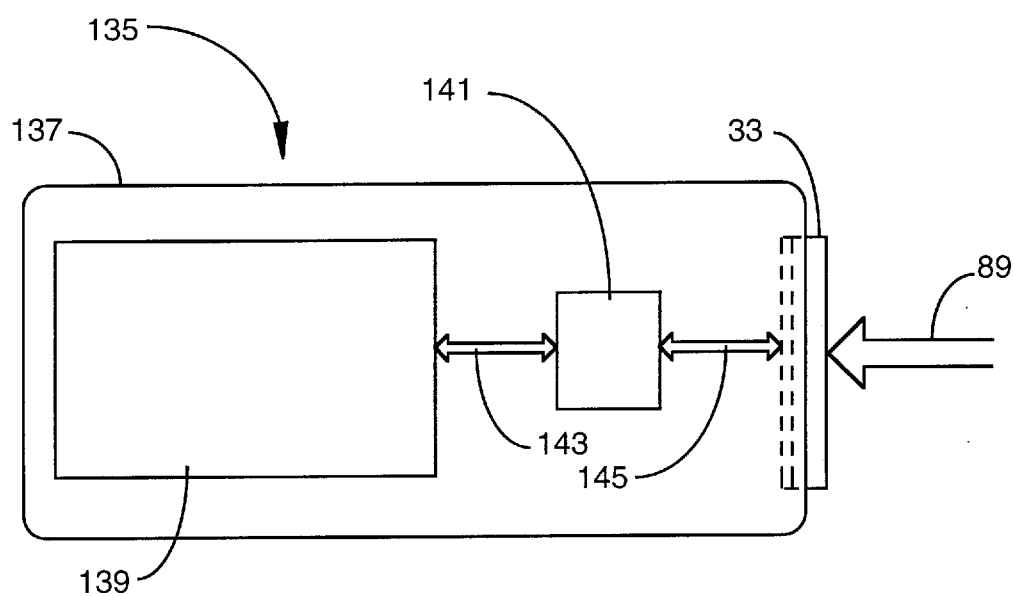
FIG. 9 is a block diagram of a hard disk drive module used in an embodiment of the invention.

FIG. 9 shows a hard disk drive (HDD) module 135 according to an embodiment of the present invention plugged into bus 89 in a module bay of framework 11. HDD module 135 comprises a conventional HDD unit 139 mounted in a case 137 to be compatible with plugging into a notebook computer according to the present invention. As in the case of the FDD module described above, a controller 141 is provided to translate between Notebus 89 and the HDD unit. Controller 141 communicates with HDD unit 139 over lines 143, and with connector 33 over lines 145. Connector 33 is exemplary of any one of the module connectors in the notebook computer.

Given the characteristics of HDD unit 139 and of Notebus 89, it is within the skill of workers in the art to implement controller 141 without undue experimentation. Power line connections are not shown. In implementing controller 141 there are several protocols that may be used. One is the ST506 standard known in the art. Another is the IDE standard known in the art. Yet another is an enhanced IDE, called EIDE, known to the inventors, and the subject of a separate patent application filed. In the EIDE protocol, there may be multiple IDE devices daisy-chained and addressed as secondary IDE devices with an additional select number.

Figure 10:
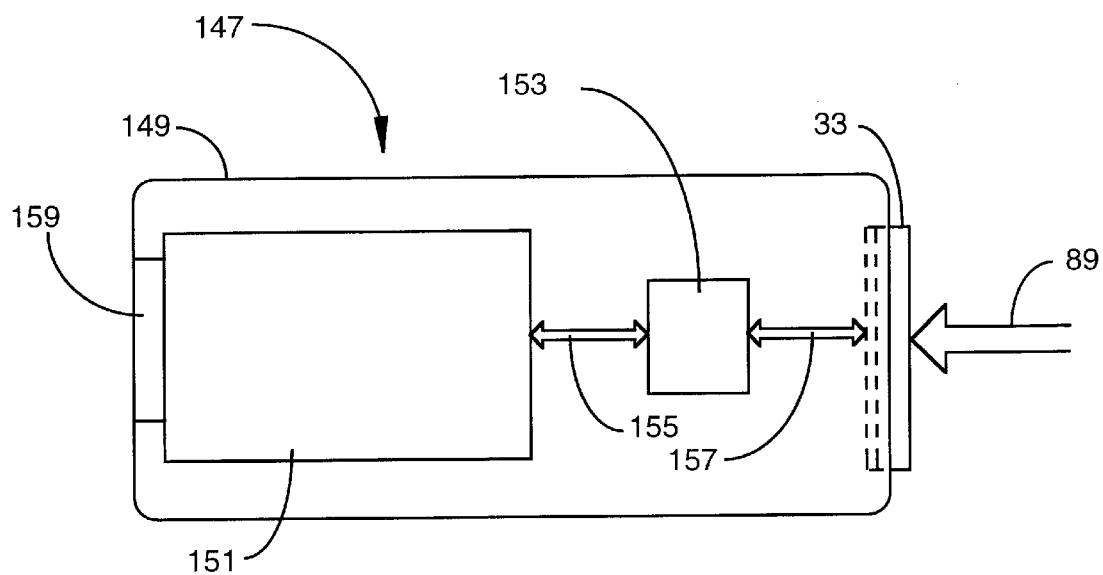
FIG. 10 is a block diagram of a "flash card" memory module according to an embodiment of the present invention.

FIG. 10 shows a "flash card" memory module 147 plugged into connector 33 of the notebook computer of the invention. "Flash cards" are RAM memory cards known in the art pluggable into typically parallel ports o make connection with internal bus structures of a computer. Module 147 comprises a conventional "flash card" 151 mounted in a case 149 compatible with the module bay of a notebook computer according to the present invention.

As in cases described above, a controller 153 is needed to accomplish communication between the memory structure of the "flash card" and bus 89. Controller 153 communicates with "flash card" unit 151 over lines 155 and with connector 33 over lines 157. There may optionally be an opening 159 in case 149 and a connector (not shown) within unit 151 for inserting and withdrawing flash cards, so relatively large collections of data may be plugged in as desired. Alternatively the interface may be the modular interface afforded by the plug-in module 147. Again, given the known characteristics of the flash card and of bus 89, implementation of the controller is a matter within the skill of workers in the art.

Figure 11:
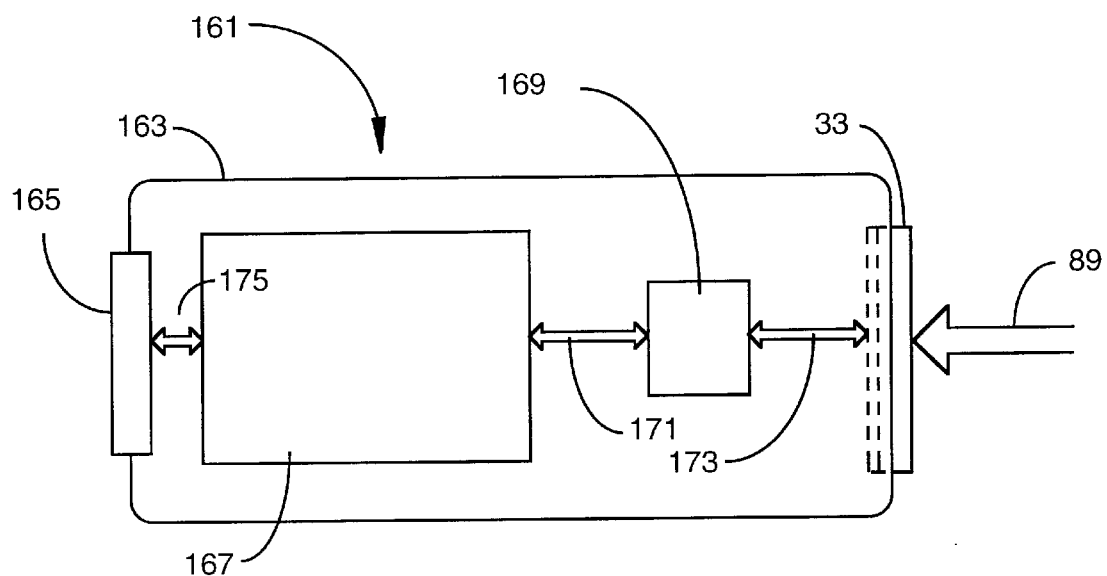
FIG. 11 is a block diagram of a LAN module according to an embodiment of the present invention.

FIG. 11 shows a LAN module 161 plugged into connector 33 of a notebook computer according to an embodiment of the present invention. In the embodiment shown in FIG. 11 a conventional LAN card, such as an Ethernet card, is mounted in a case 163 to be compatible with plugging into a module bay of a notebook computer according to an embodiment of the present invention.

LAN card 167 communicates with a conventional connector 165 in the face of the case of module 161 that is exposed when the module is plugged into a bay. This is a conventional connector of the sort known in the art for connecting computers on a network.

Within module 161, in a first alternative, conventional LAN card 167 interfaces to a controller 169 communicating over lines 171 and 173, and the controller translates between bus 89 and the conventional LAN card. In a second alternative, a LAN card is provided with the translation built in, so no separate controller is needed. The first alternative is preferable.

Figure 12:
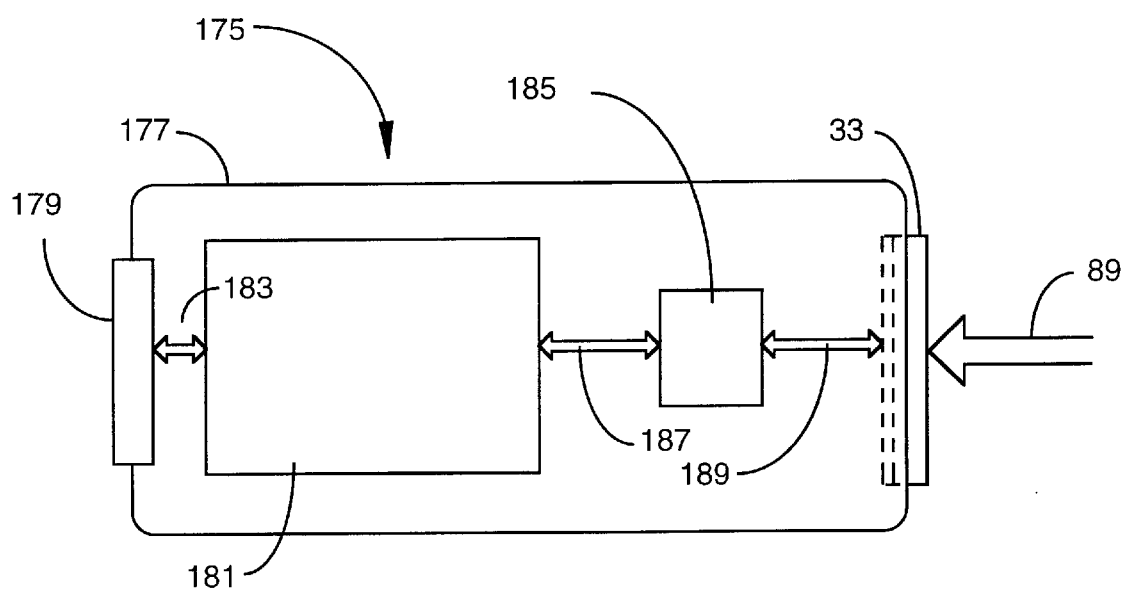
FIG. 12 is a block diagram of a modem module according to an embodiment of the present invention.

FIG. 12 shows a modem module 175 plugged into connector 33 in a bay of a notebook computer according to an embodiment of the present invention. Modem module 175 comprises a conventional modem card 181 mounted in a case 177 to be compatible with plugging into a module bay. In this case, and other cases above, where the term "conventional" is used in conjunction with a card or unit, it is meant that the circuitry and function is conventional. The size may be adjusted to be compatible with a module case for plugging into a bay of a notebook computer according to the present invention.

Modem card 181 connects over lines 183 to a telephone interface 179, which may comprise more than one "jack" so a hand set may also be connected. Card 181 communicates to Notebus 89 over lines 187 and 189 through controller 185, which translates between the conventional card and the compressed bus. Alternatively, the translation components may he implemented on a single card along with the modem circuitry.

Figure 13:
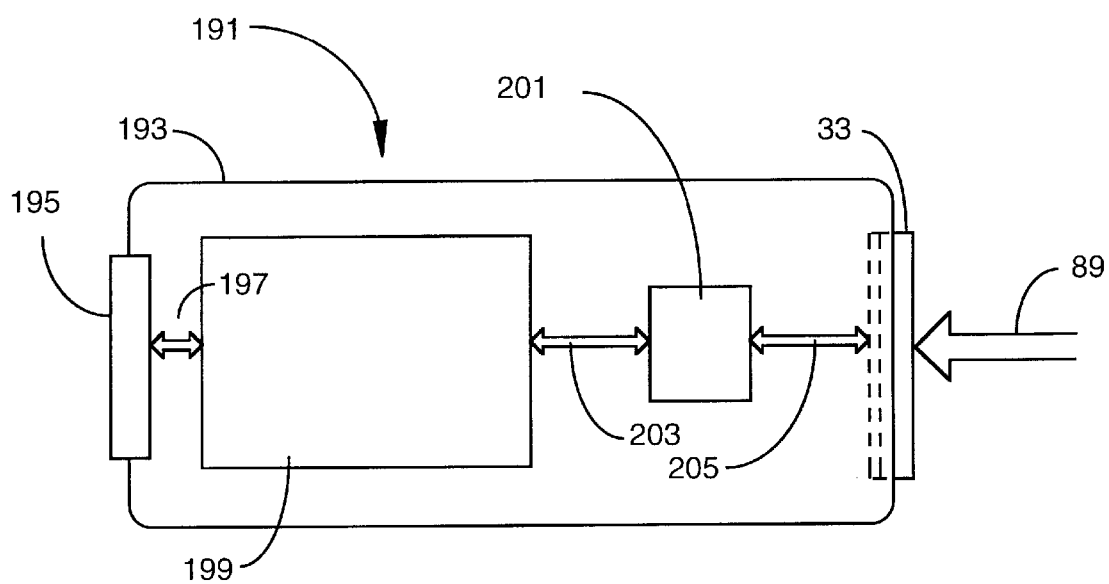
FIG. 13 is a block diagram of a FAX module according to an embodiment of the present invention.

FIG. 13 shows a FAX module 191 plugged into connector 33 of a module bay in an embodiment of the present invention. Module 191 comprises a conventional FAX card 199 mounted in a case 193 to be compatible with plugging into a module bay in the present invention. Fax card 199 communicates over lines 197 with a telephone interface 195, which may, as in the case of the modem module described above, have more than a single telephone "jack".

A controller 201 provides an interface for the conventional FAX card between the card and Notebus 89 over lines 203 and 205. Alternatively, the controller may be implemented on the same card as the FAX circuitry. In yet another alternative, the FAX capability and the modem capability described above may be implemented into a single module.

Figure 14:
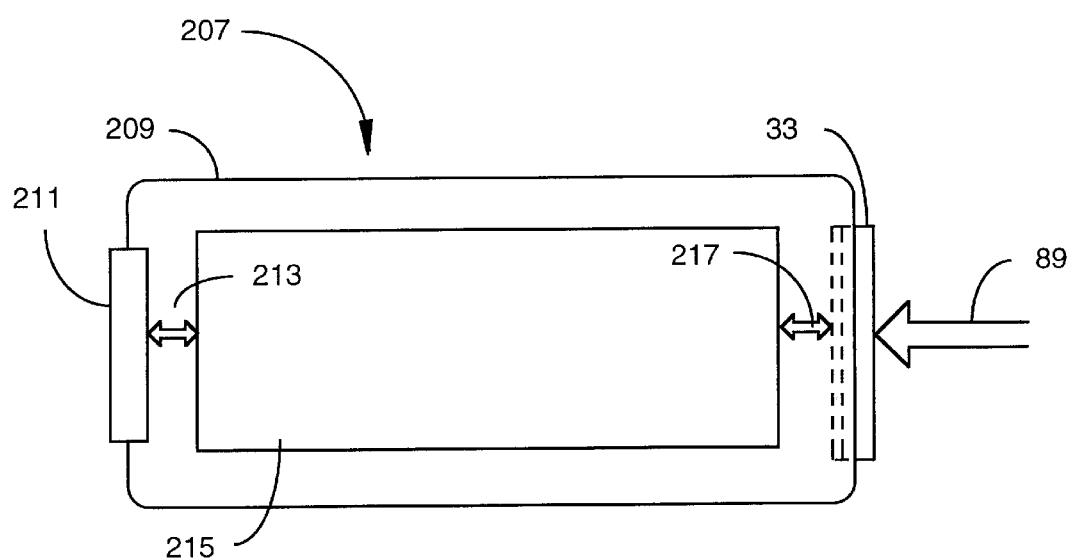
FIG. 14 is a block diagram of a data acquisition module according to an embodiment of the present invention.

FIG. 14 shows a specialty data acquisition module 207 plugged into connector 33 in a module bay in a notebook computer according to an embodiment of the present invention. Module 207 comprises a circuit card 215 mounted in a case 209 to be compatible with plugging into a module bay. Card 215 communicates over lines 213 to an interface 211 which may comprise one or several acquisition leads for connecting to outside equipment. For example, a data module may be provided for following the output of the vertical and horizontal sweep of an oscilloscope, and would have at least two input leads; one for the vertical and one for the horizontal sweep.

Card 215 communicates over lines 217 to connector 33, hence Notebus 89. The circuitry on card 215 is designed to digitize the input if the input is analog, and to be compatible with Notebus 89. Given the characteristics of signals to be measured and the characteristics of Notebus 89, implementation of such a card is within the ordinary skill in the art.

The embodiments of the present invention described above relate primarily to notebook type computers. However, the invention has broader applications. The principles of the invention are also applicable to portable computers known as palmtop computers, and further embodiments are described below.

Figure 15A:
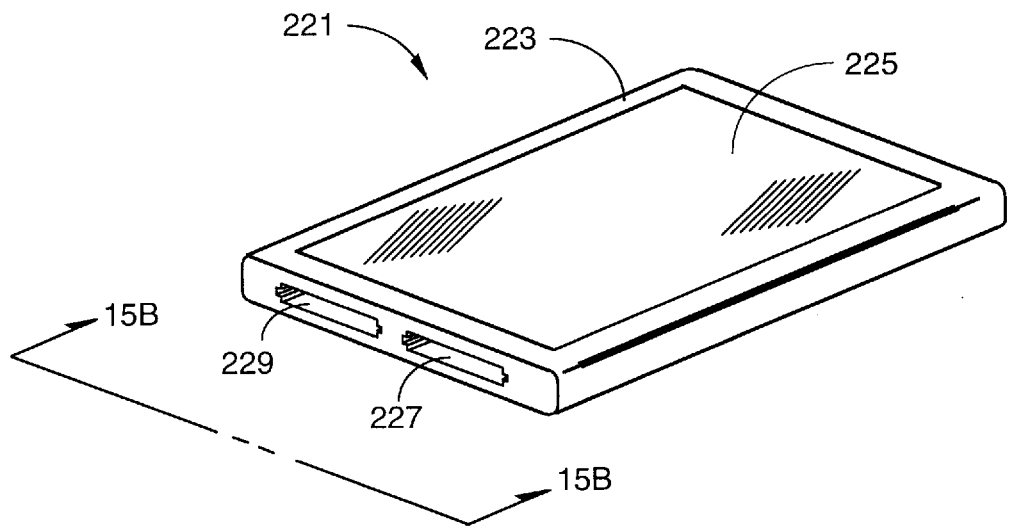
FIG. 15A is an isometric view of a modular palmtop computer framework according to an embodiment of the present invention.

FIG. 15A is an isometric view of a modular palmtop computer 221 according to an embodiment of the invention. Computer 221 is approximately the size of one-half a standard piece of paper (approximately 5.5 inches by 8.5 inches) and in a preferred embodiment comprises a planar array of four Personal Computer Memory Card International Association (PCMCIA) Type II module bays in a case 223.

In this embodiment case 223 has a combination I/O area 225 implemented on one side of computer 221, comprising a display overlaid with a touch sensitive planar structure. In other embodiments, the display may be a flat-panel display pivoted to the case, or a separate monitor in communication with case 223. The touch screen provides a "softkey" operation in conjunction with interactive control logic. In a preferred embodiment of the invention, the control logic resides in static or dynamic memory within case 223 but may also be part of an installed PCMCIA-type peripheral. A power unit (not shown) is enclosed within case 223 for converting electrical input on a wide variety of standards to the form required by the computer. For example, there is a port (not shown) for connecting to a standard household outlet, rated at 120 V., 60 Hz, alternating current. The power unit converts the input to outputs as needed by the computer bus and function modules. There are also input ports for 6 V. DC, 12 V. DC, 9 V. DC, and others, and the power unit in one embodiment of the present invention is capable of recognizing the input characteristics by sampling, and switching to proper onboard circuitry to utilize the input.

In the embodiment of the invention shown by FIG. 15A, two module bays 227 and 229 are provided on one side of case 223. There are two more module bays along the other side of the case opposite the module bays shown. In other embodiments bays may open to other edges of the case. The configuration provides a good balance between the need to stay small and simple, and to also have adequate versatility. In alternative embodiments other module configurations may be used, such as PCMCIA Type III, and others. In the alternative configurations the arrangement of the planar array of modules may vary as well.

Figure 15B:
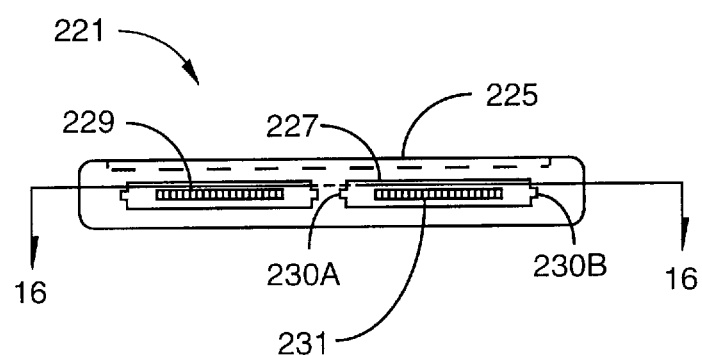
FIG. 15B is a view of the computer framework of FIG. 15A from one side from the vantage of line 15B—15B on FIG. 15A.

FIG. 15B is a view of computer 221 in the direction of arrows 15B—15B of FIG. 15A. I/O area 225 is located on top of case 223. Module bay 227 has a set of guide slots 230A and 230B. The guide slots are to position and guide a PCMCIA module card inserted into the module bay. Each module bay in this embodiment is configured to PCMCIA dimensional and connective standards and secures the fitted PCMCIA cards according to those standards. In this embodiment of the present invention, case 223 has bays configured to PCMCIA type 2, revision B standard. In another embodiment of the invention, the case may have other types of PCMCIA module bays, or bays configured to one or another proprietary standard.

Each module bay has a bus connector, such as connector 231. In this embodiment, connector 231 is a standard PCMCIA connector that accepts PCMCIA cards and is electrically connected to the palmtop's internal bus. It will be apparent to those with skill in the art that there are a number of equivalent ways to connect a function module.

Figure 16:
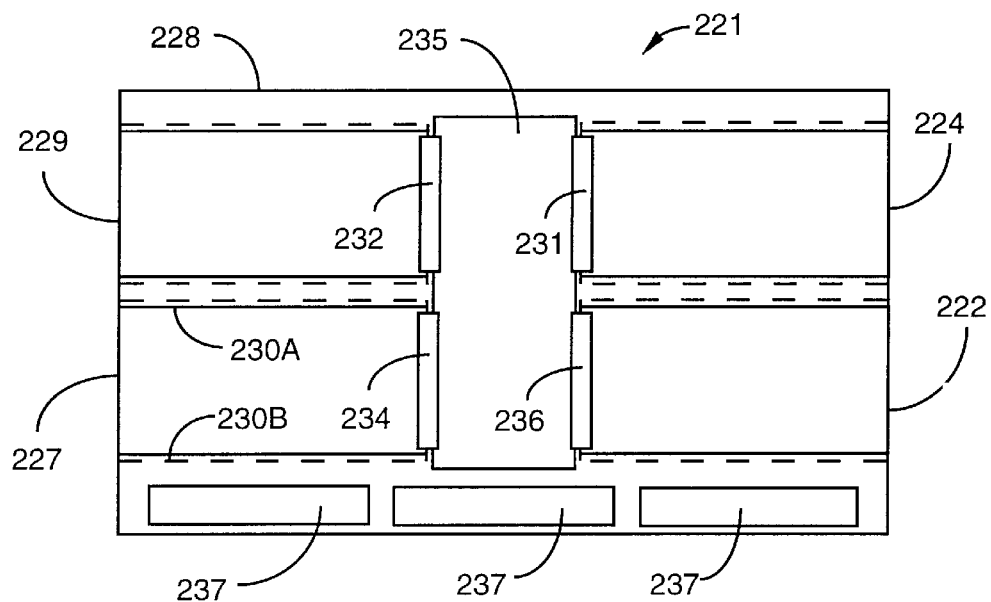
FIG. 16 is a sectioned plan view of the computer framework of FIG. 15A taken along section line 16—16 of FIG. 15B.

FIG. 16 is a simplified plan sectional view of computer 221 taken according to section line 16—16 of FIG. 15B. Frame 228 frames four PCMCIA module bays 222, 224, 227 and 229 arranged in a planar array. A printed circuit board structure 235 is fastened and positioned down the center of frame 228, and connectors 231, 232, 234 and 236 are connected to the printed circuit board structure and present their pin structure outward toward the respective bay areas. In the presently described embodiment, the internal connectors are male connectors, but this is not a requirement of the invention.

Slots 230A and 230B serve to guide a PCMCIA-type card into module bay 227, and similar slots are located in cach of the other module bays shown as dotted lines in the sectional view. A set of three AA batteries 237 are located generally in the plane of the module bays and provide a portable power means in one embodiment. In another embodiment, outside power sources may power computer 221 as described above.

Figure 17:
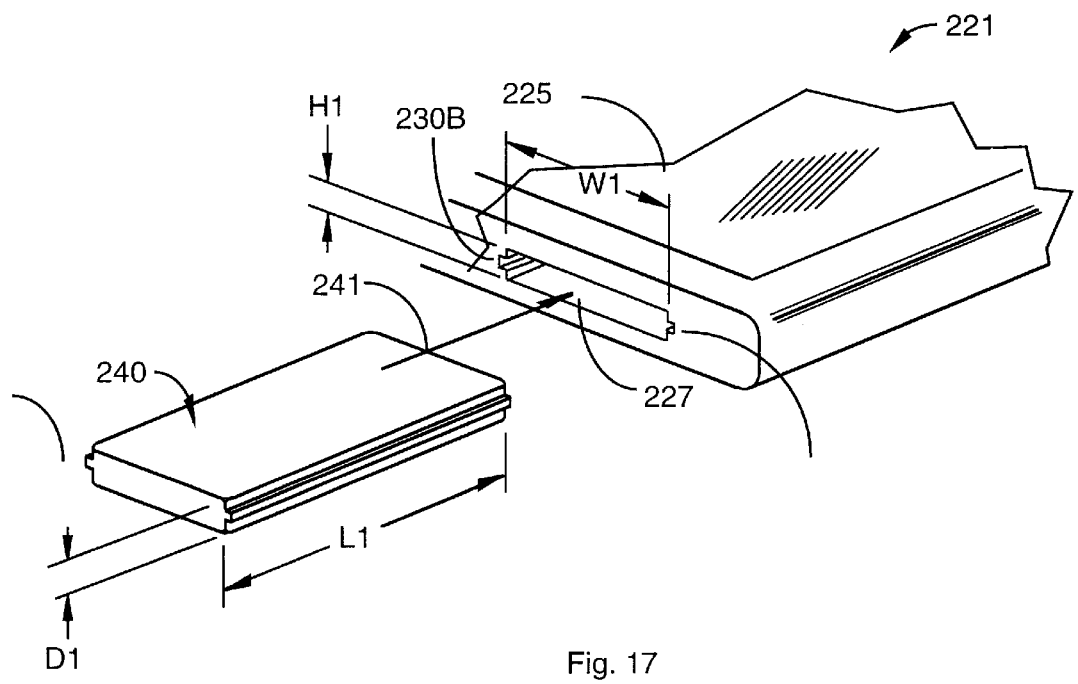
FIG. 17 is an isometric illustration showing a function module and a dedicated docking bay in an embodiment of the present invention.

FIG. 17 is a partial isometric view of a function module 240 according to an embodiment the invention, aligned with module bay 227 of computer 221. Arrow 241 shows the direction of insertion of the function module. I/O area 225 is implemented on top of case 223 in a plane parallel with the plane of the module bays. Module 240 is a Type 2 PCMCIA card and has a thickness Dl. The opening of module bay 227 has width WI and height H1. The length of function module 240 is L1. In this embodiment of the present invention, these dimensions conform to PCMCIA industry standards. In an alternative embodiment of the present invention, module bay 227 may change in dimension to accommodate other standard or proprietary modules.

Module bay 227 engages function module 240 in the full inserted position according to PCMCIA standards. In another embodiment of the invention, detents may be provided similar to those in FIG. 3 for the larger notebook computer embodiment. There are a number of ways known in the art to position and secure a small module. Securing a module may also be accomplished by other means, such as clamping or wedging and/or closing retaining mechanisms.

Figure 18:
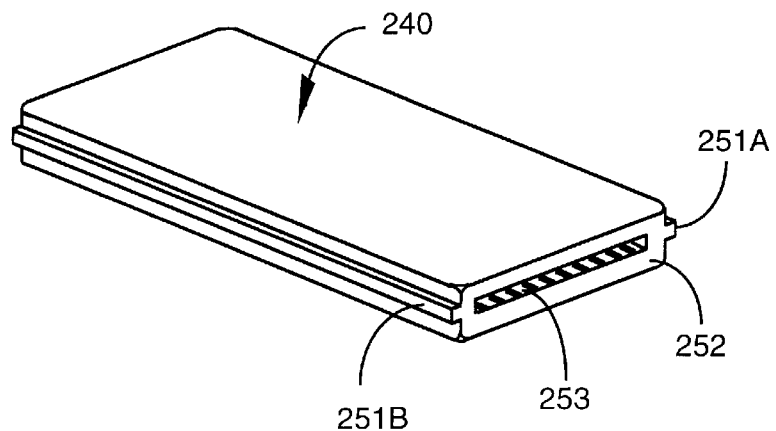
FIG. 18 is another view of a function module according to an embodiment of the present invention.

FIG. 18 is an enlarged isometric view of function module 240 according to Type 2 PCMCIA standards. Back face 252 includes a female connector 253 for mating with a male connector positioned in each module bay, such as connector 231 in FIG. 15B and FIG. 16. Connectors 231 and 253 are PCMCIA connectors and interface according to that industrial standard. Guide 251A and 251B are sized according to the PCMCIA standards.

Function modules are provided in many models capable of a wide range of functions. For example, computer 221 in one embodiment has no onboard CPU or system memory. These functions are provided by function modules that may be inserted in any one of the available module bays. Other kinds of function modules that may be inserted include I/O system modules that provide speech-based, pen-based or keyboard based input. There are also floppy-disk drives, hard-disk drives, flashcard memory modules, LAN and modem adapters, Fax modules, specialty modules such as data acquisition modules adapted to specific equipment, specialty video modules, modules to adapt scanner peripherals to the computer, telephone adapters, and more.

In the case of I/O modules, necessary software, and in some cases firmware and hardware, may be connected to the internal bus structure by the insertion of a module. For example, a module is provided in one embodiment comprising an induction coil and a controller for decoding signals received via a varying magnetic field and providing code to the computer's internal bus. The varying magnetic field is produced by a stand-alone keyboard wherein the keystrokes are coded and transmitted as signals on the field.

In another embodiment, a similar module provides for communication from an auxiliary pen-based input pad. In yet another embodiment, a plug-in module provides a microphone, DSP circuitry, and necessary software to accept input from a user by voice, and to convert the voice input to machine-readable code. Provision of the necessary software and circuitry in these instances in module form provide maximum flexibility and upgradability for modular systems according to the invention.

Electronic Architecture

Figure 19:
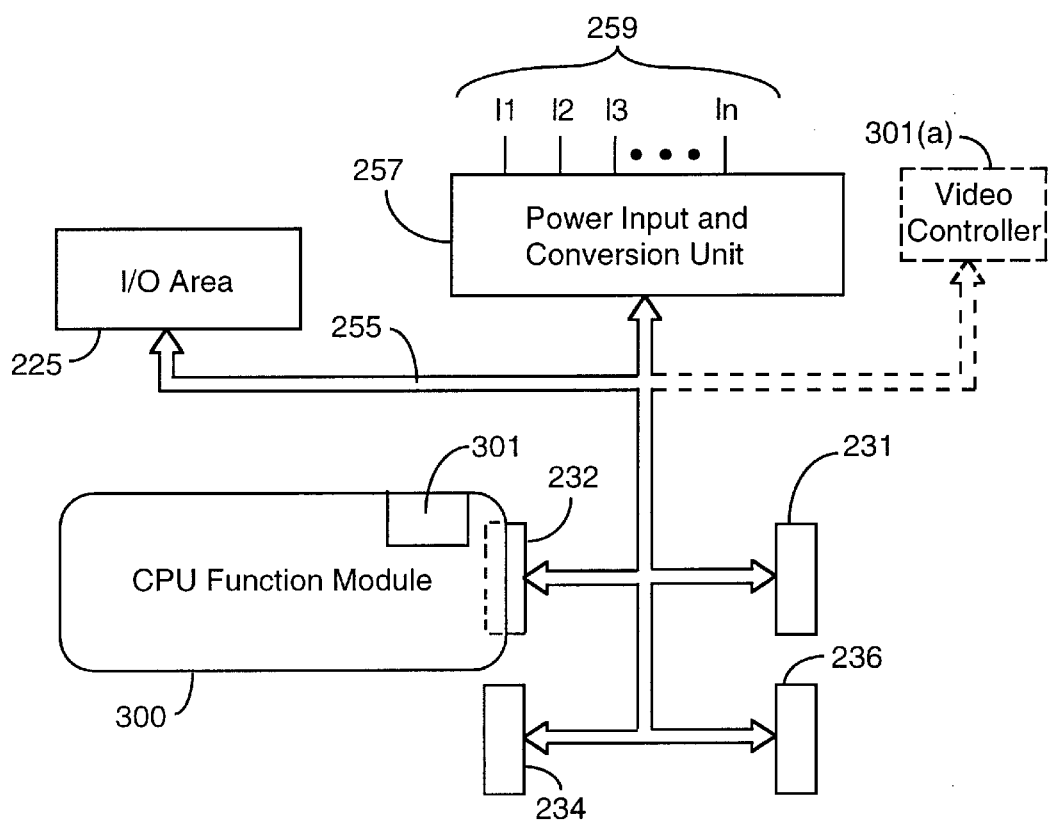
FIG. 19 is a block diagram of a compressed bus and connection to docking bays in a computer framework according to an embodiment of the present invention.

FIG. 19 is a block diagram showing internal elements of palmtop computer 221, connected to show the electronic architecture of the modular computer according to an embodiment of the invention. A power input and/or conversion unit 257 is housed in case 223 (FIG. 15A) and has ports 259 for power inputs. Power input may be from AA batteries 237 (FIG. 16) or from an optional conversion unit via outside electrical sources. Conversion unit 257 senses the input conditions and selects appropriate circuitry to convert the input to the voltages needed to power the elements of the system. Output from the conversion unit is to bus 255, which comprises paths for power as well as for digital information such as data and addresses.

Because there are a wide variety of function modules, as indicated above and described in more detail below, there needs typically to be more than one power line in bus 255. For example, computer 221 may utilize hard disk drive modules, and these modules are preferably provided without onboard power sources. The motor drive for a hard disk requires a different power configuration (voltage and current) than does a CPU, for example, so there may be parallel power lines of differing size and voltage level in bus 255. Bus 255 may have a line for 24 V DC, another for 12 V DC, and yet another for 5 V DC, as well as perhaps multiple ground lines.

Bus 255 connects I/O area 225 and transmits video signals from a video controller. The video controller may be integral to a function module, which is shown as video controller 301 in a CPU function module 300, or implemented in the case, shown as optional video controller 301(a). As described above in a preferred embodiment of the present invention, I/O area 225 is a combination display with an overlaid touch sensitive screen. In another aspect, the I/O area may comprise an active-matrix display, in which case, dedicated analog driver lines from video controller 301 connect to the display. I/O area 225 may also comprise a conventional LCD display wherein I/O control logic is a function of an installed and dedicated I/O peripheral modules. In an alternative embodiment, video controller 301 is built into case 223 (FIG. 15A), and connected directly to bus 255, similar to the modular notebook computer described above.

Bus 255 connects to each of module bays 222, 224, 226 and 227 (FIG. 16) through connectors 232, 234, 236 and 231. When a function module, such as CPU module 300, is inserted into a module bay, female connector 253 (FIG. 18) mates with the respective male connector 232 located in that module bay, and circuitry inside the CPU module is then connected to bus 255.

Palmtop Function CPU Module

The onboard video controller 301 built into CPU function module 300 is a unique feature in one aspect of the present invention. A user is provided an ability to tailor the CPU power and type of video controller to the other modules and applications for palmtop computer 221. This provides a simple means for upgrading by switching CPU function modules. Video signals are local to the CPU, which increases system performance.

Figure 20:
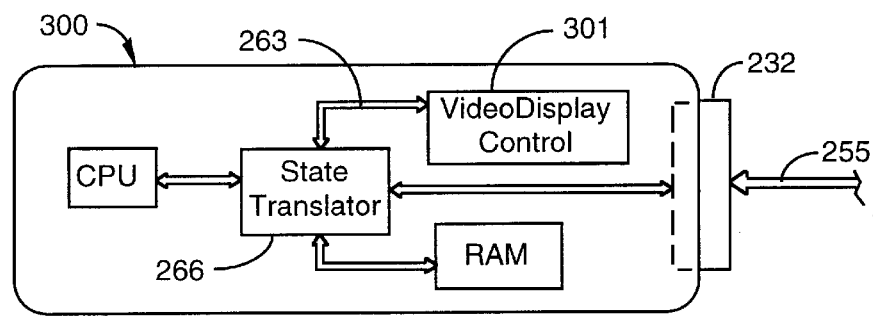
FIG. 20 is a block diagram of a CPU function module according to an embodiment of the present invention.

FIG. 20 is a more detailed diagram of CPU module 300 for computer 221. CPU module 300 is similar in function to CPU module 99 (FIG. 6), except for the addition of video controller 301. Onboard video controller 301 is bus connected by line 263 to a state translator 266. In this embodiment of the invention, the state translator is configured to transmit and receive video signals and commands over bus 255 via connector 231 as well as other functions as described above.

Other Aspects and Features

The embodiments of the present invention described above specifically address notebook-type and palmtop-type computers. The embodiment described below addresses yet another aspect of the palmtop type computers.

Figure 21:
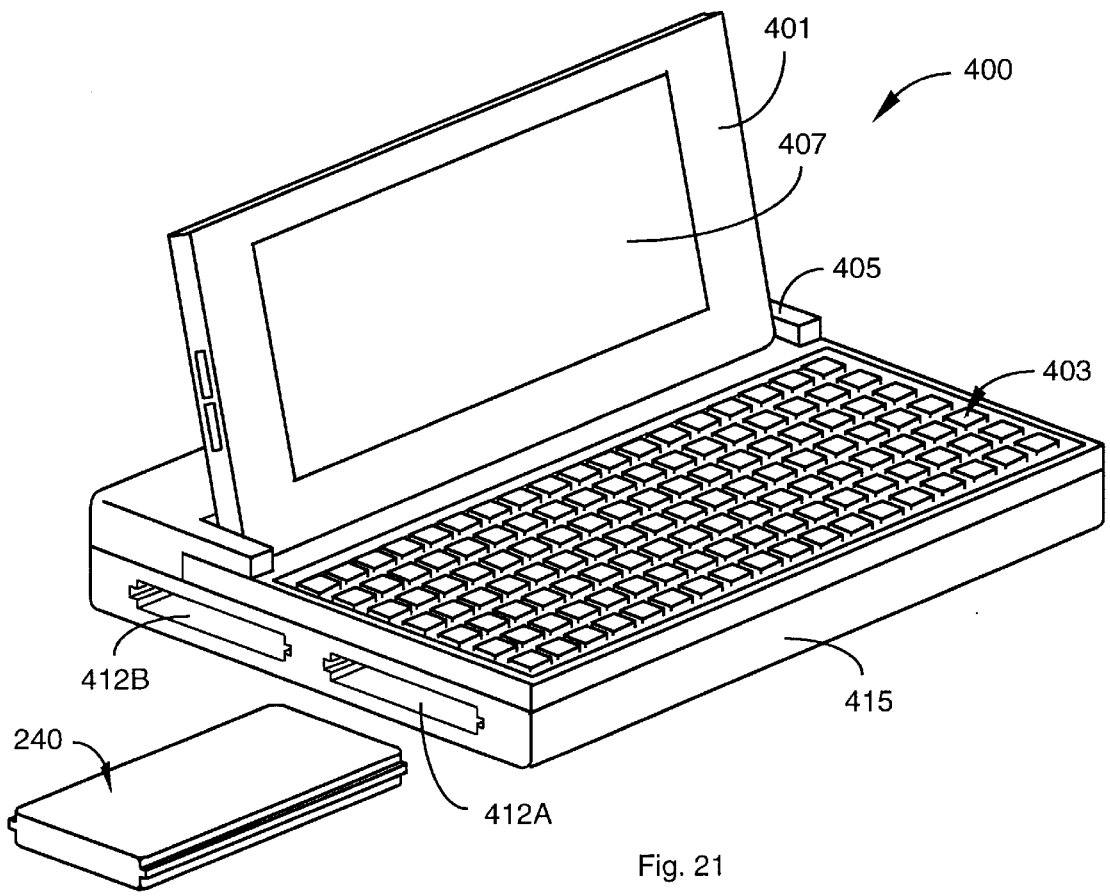
FIG. 21 is an isometric drawing of modular palmtop computer according to another embodiment of the present invention.

FIG. 21 is an isometric drawing of another embodiment of the present invention. Computer 400 comprises an attached pivotable display case 401 and a fixed keyboard 403. The display case rotates about a hinge 405 and closes in a fixed detented position above the keyboard. Display case 401 comprises a flat-panel display 407. There are two PCMCIA-type module bays 412A and 412B on one side of the case, and two more (not shown) on the side opposite. The four PCMCIA module bays are arranged in a planar array as described above. A frame 415 contains a bus structure (not shown) that interconnects all aspects of the PCMCIA type module bays to computer 400 as described above. In this embodiment of the present invention, a standard keyboard controller (not shown) enclosed in frame 415 connects keyboard 403 to the internal bus structure.

As was indicated above in the "Background of the Invention" section, a problem with small computers is the design and interfacing of pointer devices to such computers. A number of unique pointers are disclosed in conjunction with compartments in a computer case for storing the pointers.

Figure 22A:
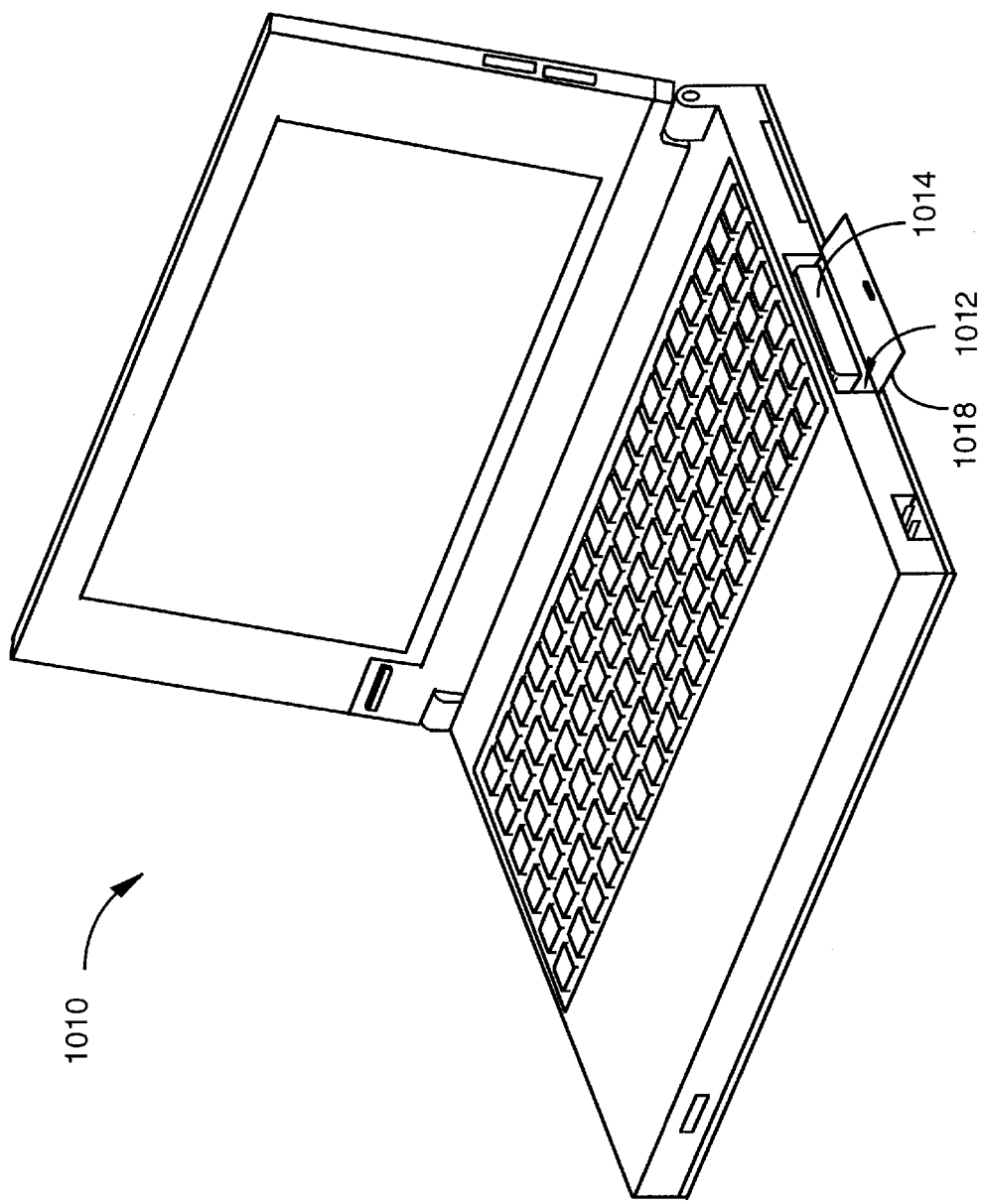
FIG. 22A is an isometric view of a notebook-type computer with a removable pointer device stored in an on-board compartment according to an embodiment of the present invention.

FIG. 22A is an isometric view of a notebook-type computer 1010 with a compartment 1012 having a closure 1018, for storing a pointer device 1014 when the pointer is not needed. The compartment is shown on one side of the housing of the computer, but could as easily be located elsewhere, and there a variety of ways the closure could be provided. The pointer may be any one of many sorts, such as joystick, trackball, or mouse device.

FIG. 22B is an isometric view similar to FIG. 22A showing a mouse-type pointer device 1020 deployed for use from compartment 1012, and connected to the host computer by a cable 1022. The cable may be stored in this case in compartment 1012 along with the pointer device. There are also alternative ways the cable might connect, such as at a parallel or a serial port on the host.

Figure 22C:
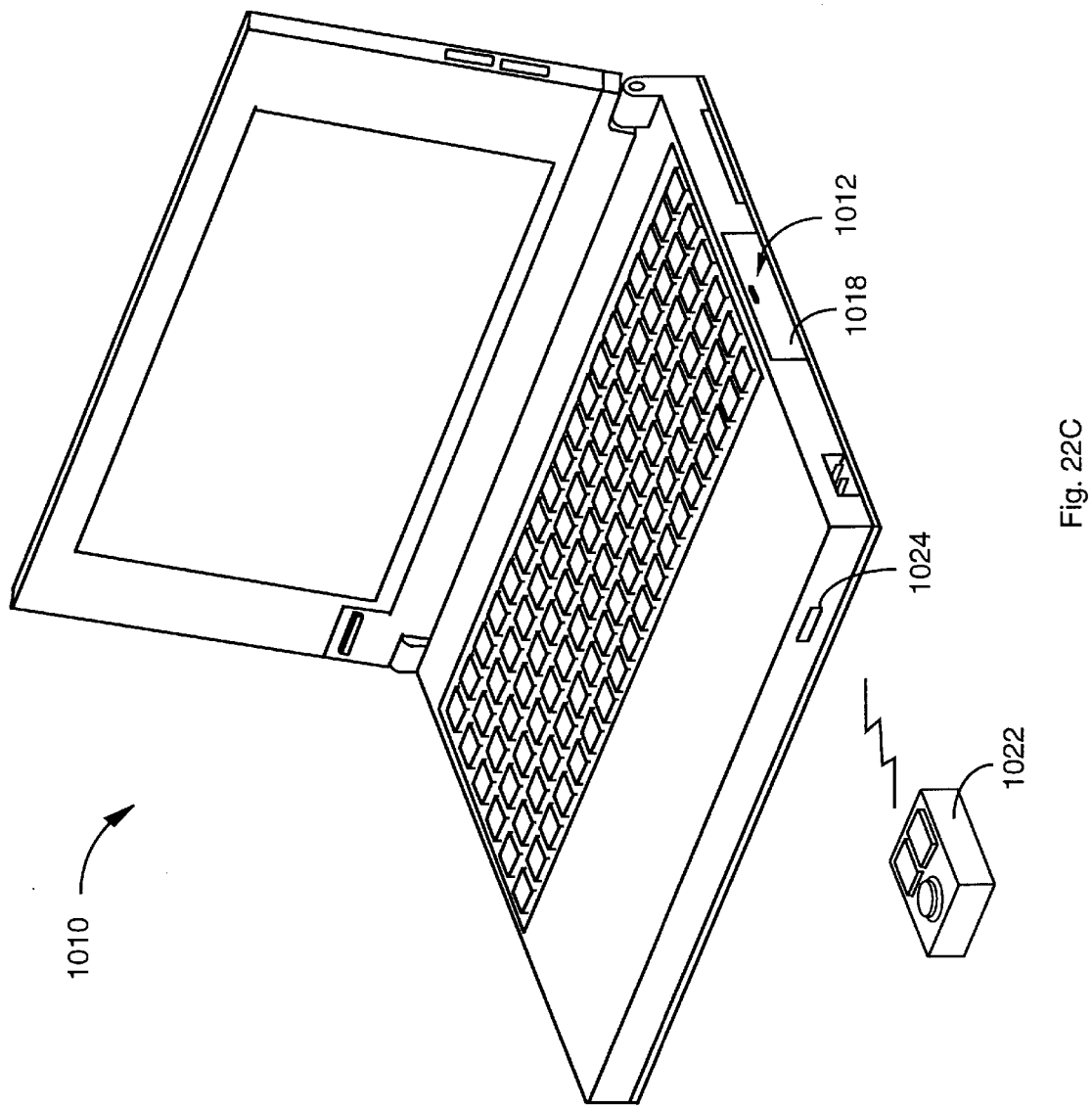
FIG. 22C is an isometric view of a notebook-type computer with a cordless ouse device deployed for use.

FIG. 22C is an isometric view of a notebook computer showing a cordless mouse device 1022 storable in compartment 1012 and deployed for use. There are several ways communication may be handled for the pointer device in this embodiment. In the embodiment of FIG. 22C the pointer has an infra-red transmitter and the host has an infra-red receiver 1024.

FIG. 22D is an isometric view of a notebook computer showing a trackball pointer device 1028 connected to the host by a cable 1030. The communication system in this case is the same as for a mouse-type device as described above.

Figure 22E:
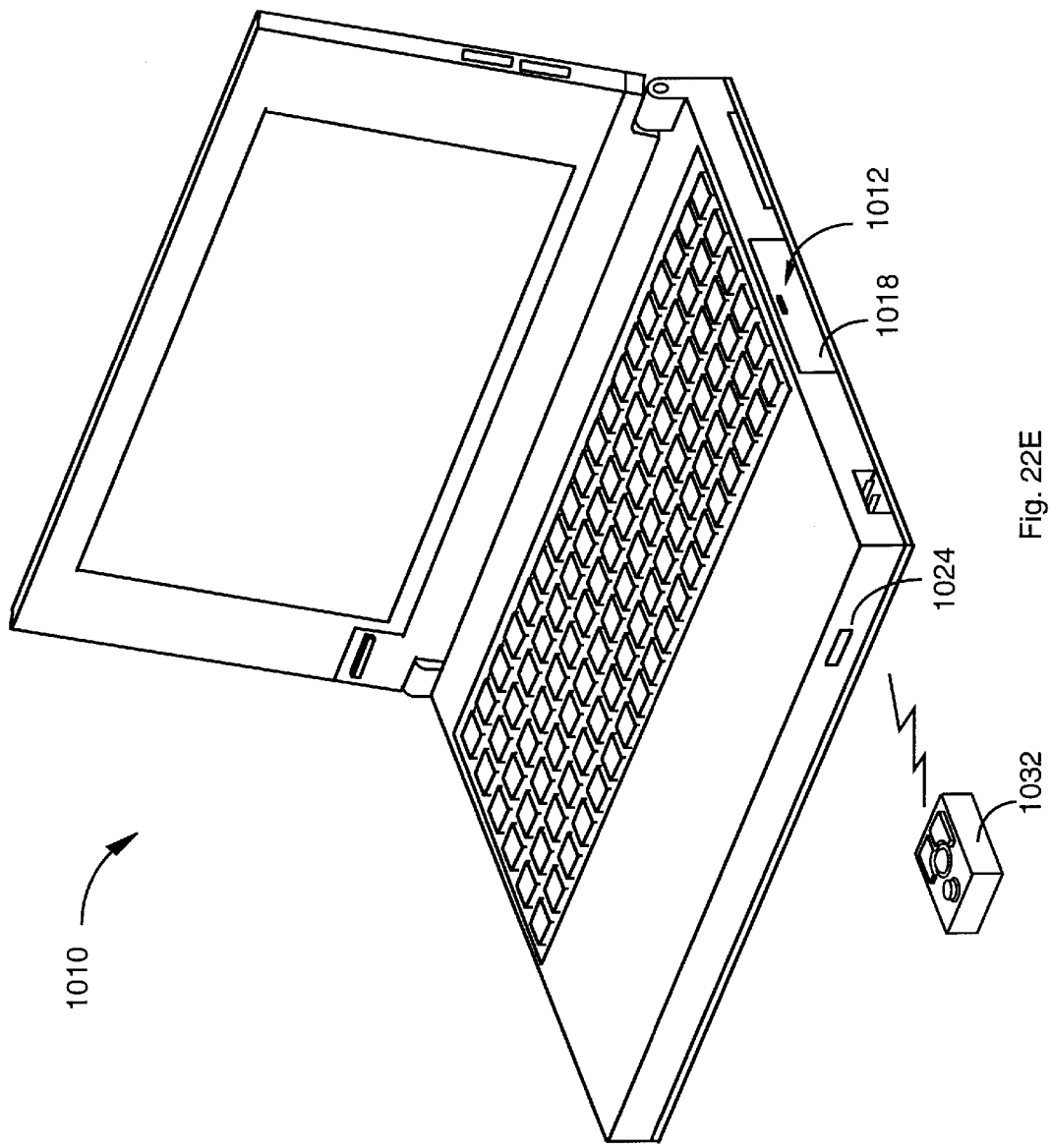
FIG. 22E is an isometric view of a notebook-type computer with a cordless trackball device deployed for use.

FIG. 22E is an isometric view of a notebook computer showing a cordless trackball device 1032 deployed for use. The cordless trackball in this embodiment employs an infra-rad coded transmission system sending code according to trackball movement to receiver 1024 at the host.

Figure 22F:
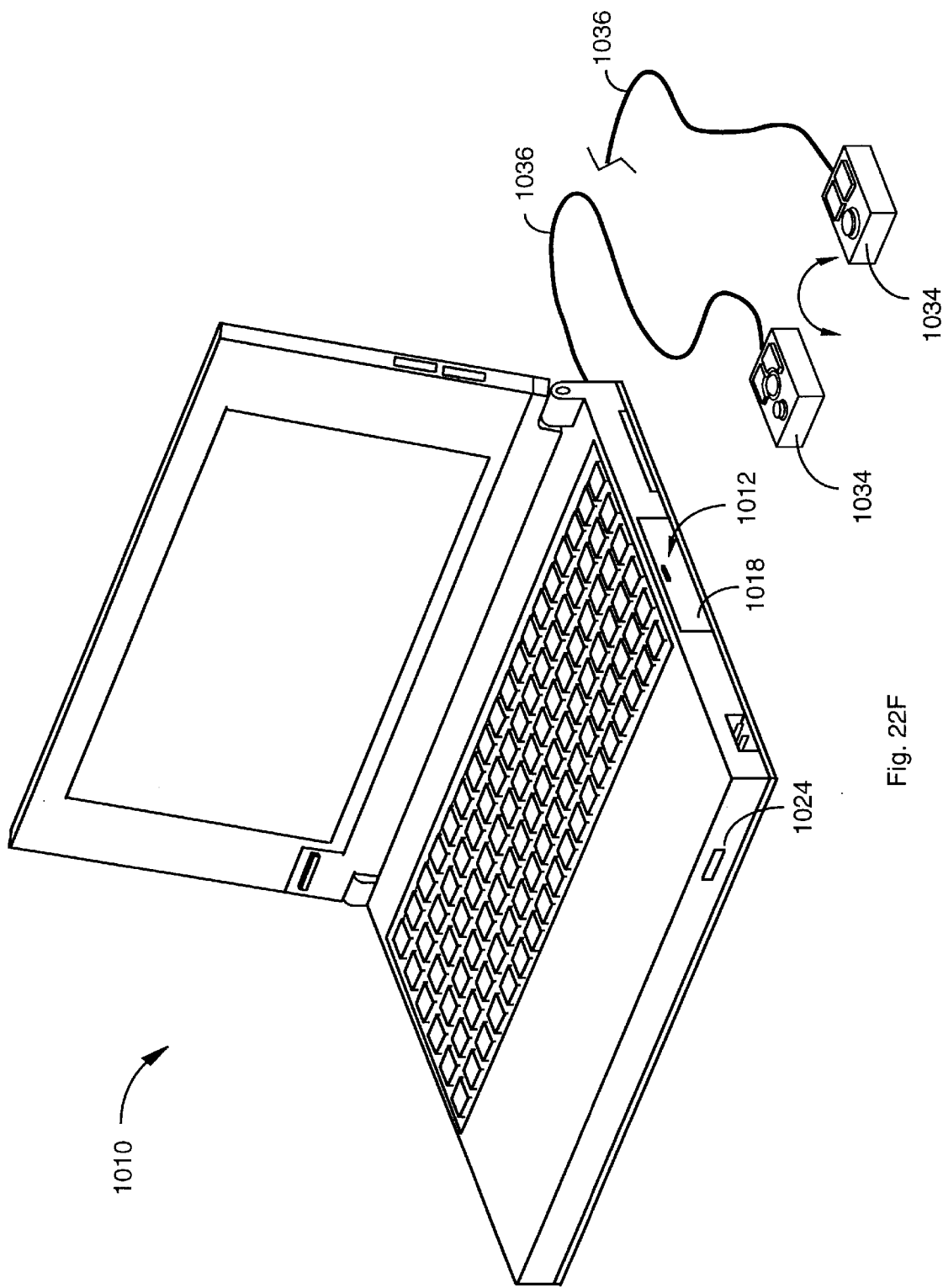
FIG. 22F is an isometric view of a notebook-type computer with a cord-connected combination mouse/trackball device deployed for use.

FIG. 22F is an isometric view of a notebook computer showing a combination pointer/trackball device 1034 deployed for use and connected by a cable 1036 to the host. This device is a combination device operable as a trackball in one orientation, and as a mouse device when inverted so the trackball may make contact with a flat surface. Further details of the combination are described below with reference to FIGS. 26 A–D.

Figure 22G:
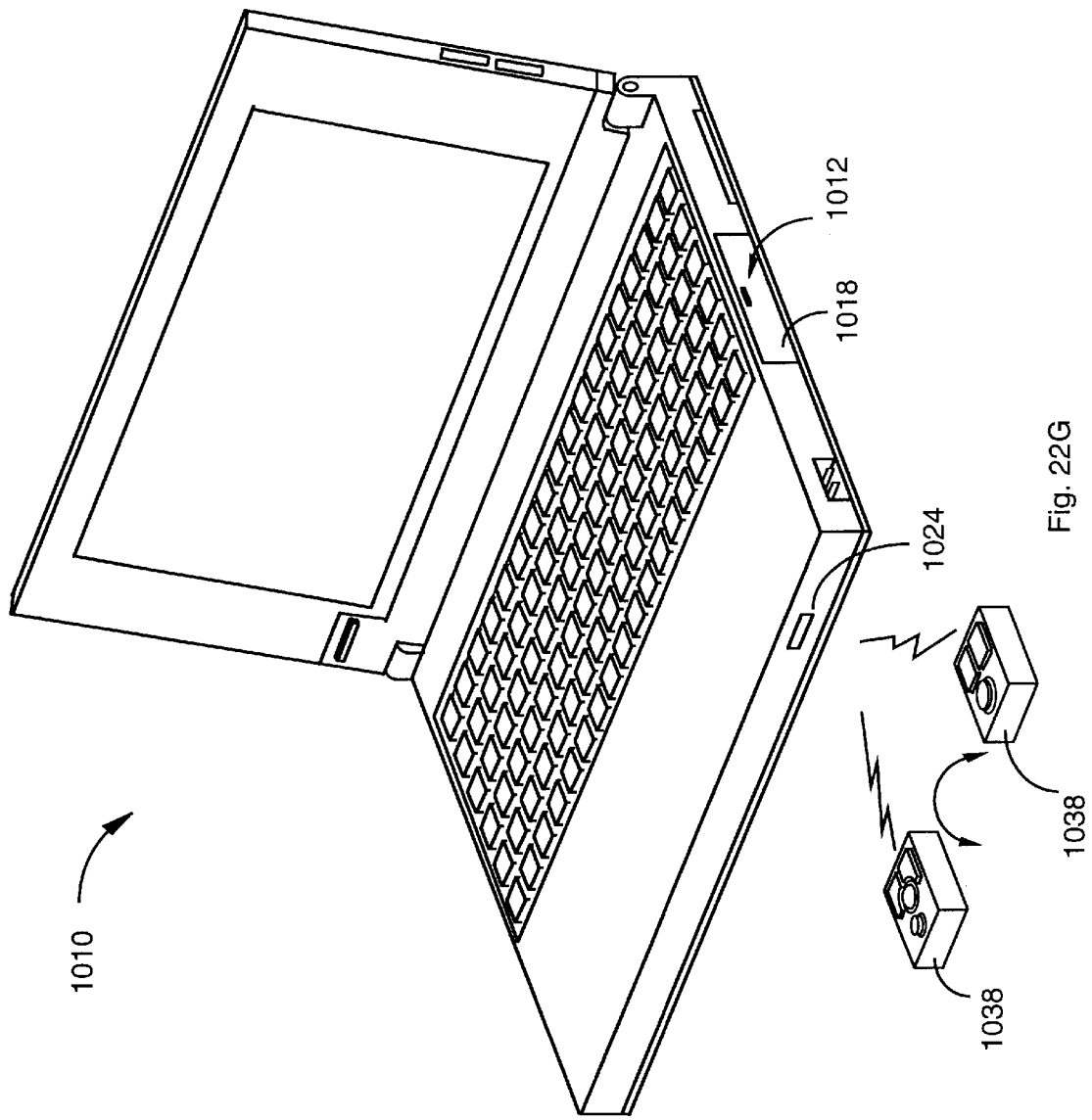
FIG. 22G is an isometric view of a notebook-type computer with a cordless combination mouse/trackball device deployed for use.

FIG. 22G is an isometric view of a notebook computer showing a combination trackball/pointer device 1038 with cordless communication, and deployed from compartment 1012 for use. In this case, the communication system is infra-red, and there is a receiver 1024 on the host.

Figure 22H:
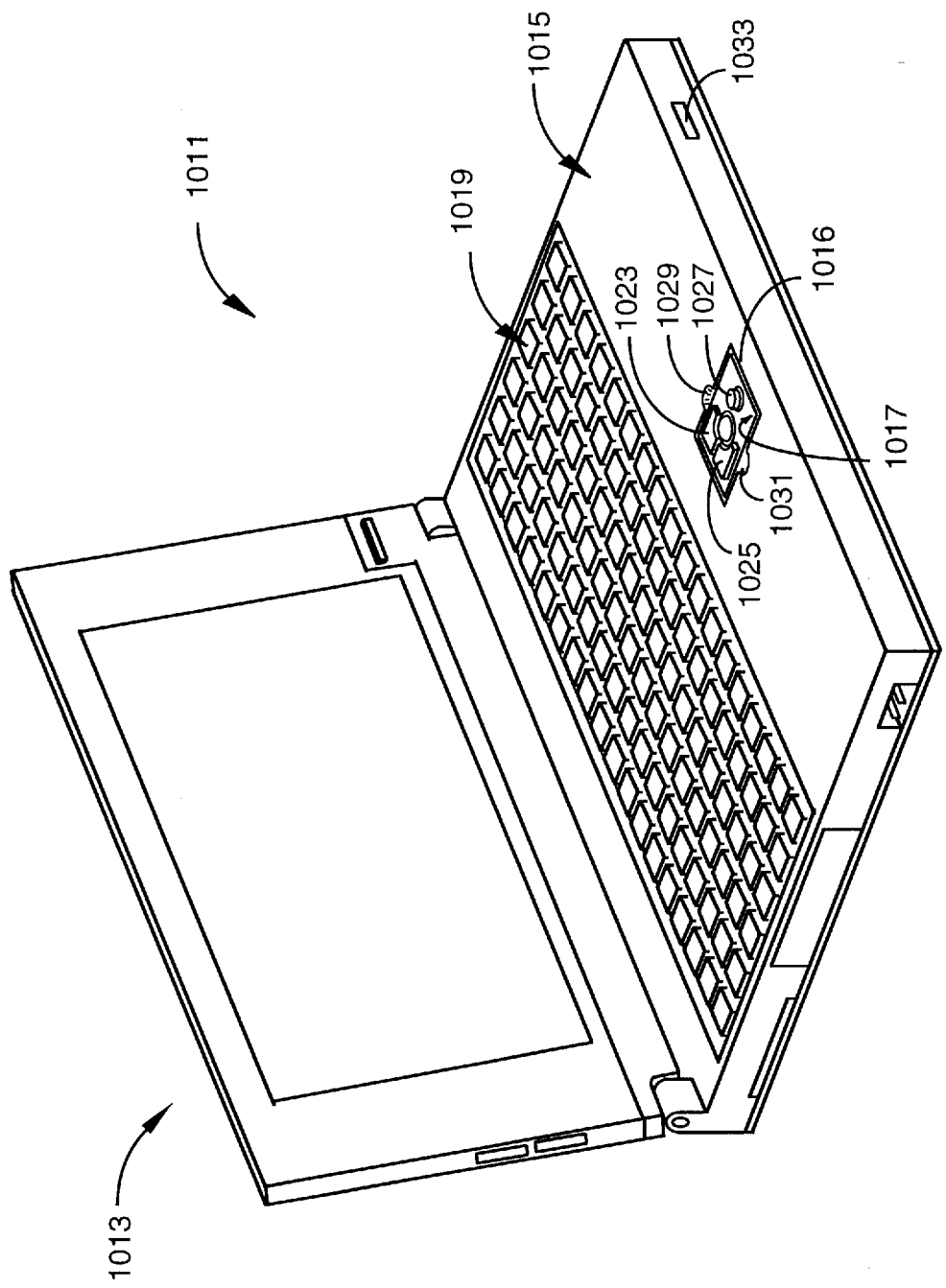
FIG. 22H is an isometric view of a notebook-type computer with a trackball pointer mounted in a well according to an embodiment of the present invention.

FIG. 22H is an isometric view of a general-purpose portable computer 101 1 with a removable pointer device 1017 according to an embodiment of the present invention. Computer 1011 comprises a housing 1015 and a tilt-up display 1013. The computer housing encloses standard electronic operating elements, such as a CPU microprocessor and system RAM, not shown in FIG. 22H. There are connectors (not shown) to serial devices and the like, which are typical for portable computers. A keyboard unit 1019 provides a for user input. Removable pointer device 1017, inset in well 1016 in the housing, comprises a trackball design including a rotatable ball 1021 to transmit directional information to the host, left and right control buttons 1023 and 1025 for discrete signalling, and a drag control button 1027. The purpose of drag control button 1027 is to signal that trackball movement is to be directed toward dragging an onscreen virtual object, a procedure well known in the art. Concave depressions 1029 and 1031 on opposite sides of well 1016 allow space for a user to grasp the removable pointer device to snap it in and out of the well so it can be used as a separate unit.

The transmission medium between removable pointer and host in this embodiment is infrared, which is transmitted from a light-emitting diode (LED). Two photodiode receivers are imbedded in the computer housing, one in a wall of the well for stationary mode reception (not shown in FIG. 22H) and one receiver 1033 in the front of the housing for portable mode reception. The photodiode receivers are connected with a common circuitry within the host computer.

Figure 22I:
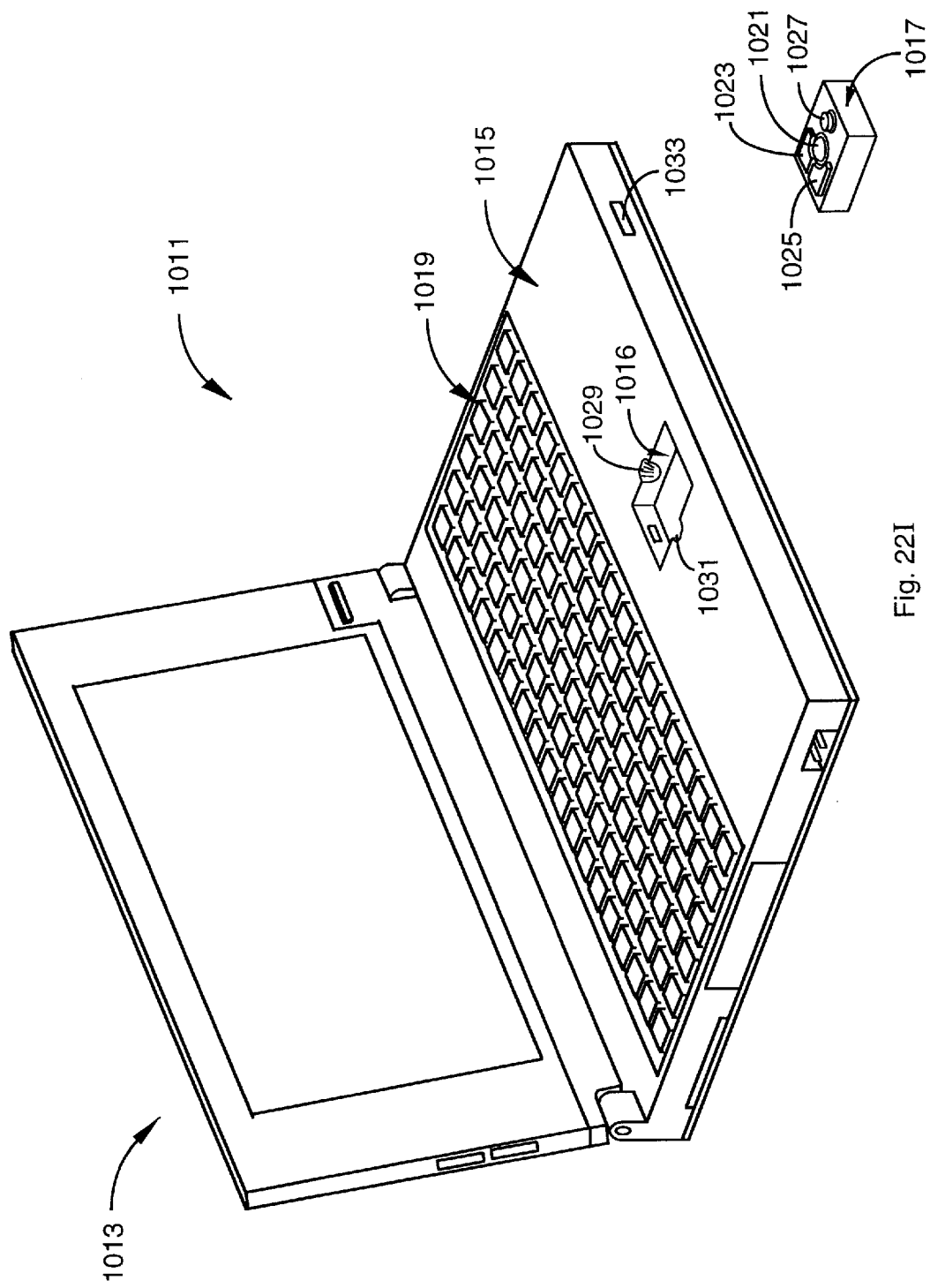
FIG. 22I is an isometric view similar to FIG. 22H, showing the trackball inter deployed for use away from the well.

FIG. 22I is an isometric view of computer 1011 with pointer device 1017 removed from the well in the housing, deployed for use external to the housing.

Figure 23:
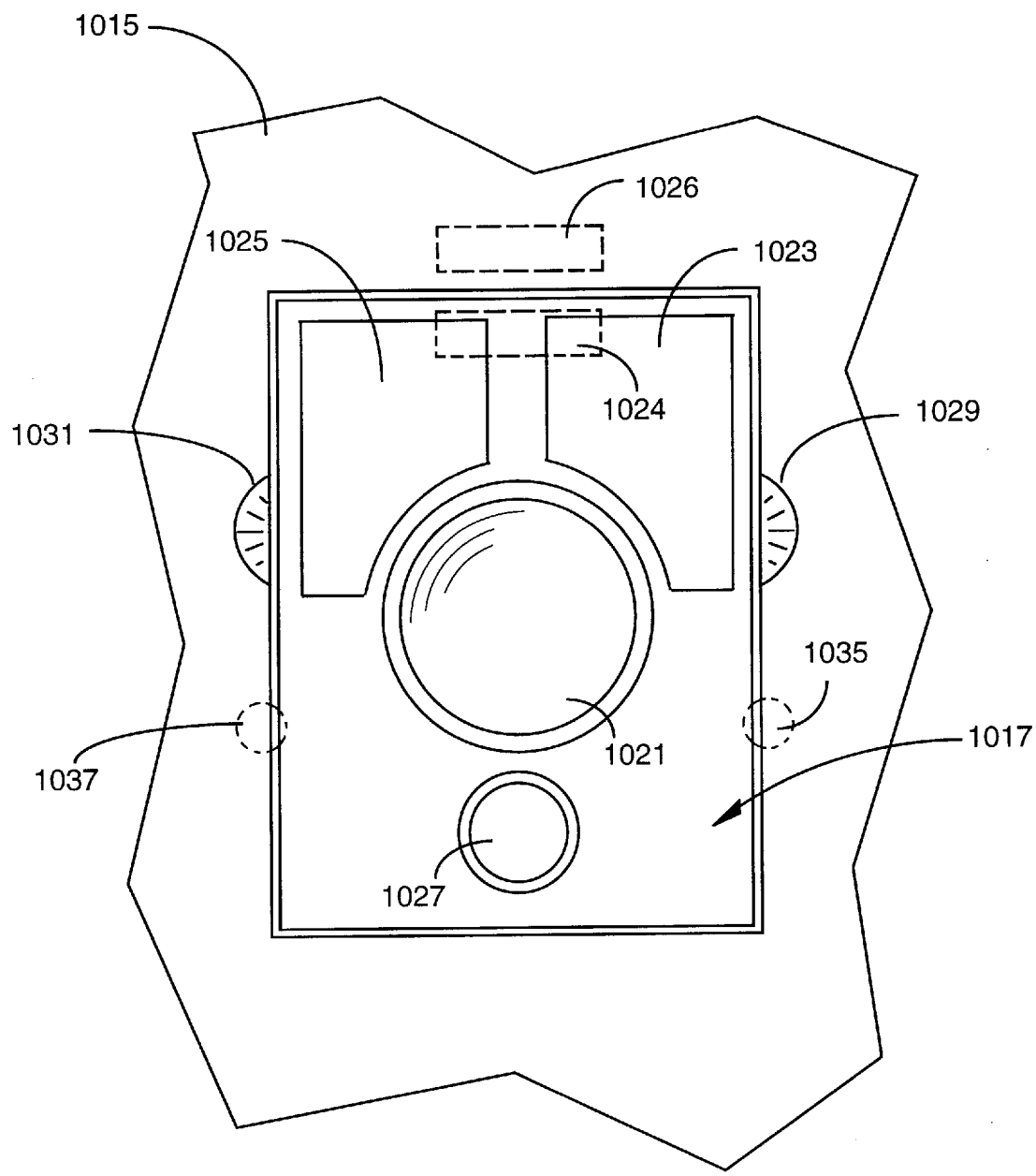
FIG. 23 is a plan view of the removable pointer device of FIG. 22H and 22I, and surrounding areas of the host.

FIG. 23 is a plan view of removable pointer device 1017, showing LED transmitter 1024 inside the device facing photodiode receiver 1026 inside a wall of well 1016. In the side walls of well 1016, concave depressions 1029 and 1031 allow a user to grasp removable pointer device 1017 and snap it in or out of well 1016. The removable pointer device is held in place in this embodiment by light resistance provided by spring-loaded ball/detent pairs 1035 and 1037 on both sides of the device. Spring loading may originate from either the pointer device or in the wall of the well. Vertical guide rails along the well walls, not shown in FIG. 23, allow detents 1035 and 1037 to slide smoothly into the well and snap into place once seated.

The method of docking and latching a removable pointer device into a location in the computer host is not limited to the description for this embodiment. There are known in the art many other equivalent ways that can satisfactorily perform such a function. For instance, instead of the pointer device being seated squarely in the well, the device can be inserted at a slant into the well and snapped down into a spring-loaded base. The device can be released by the user pressing an indentation near the base of the device. Another variation is for the well to open to the front of the housing so the pointer device can slide in and out on guide rails. Spring-loaded detents along the sides hold the device in place while it is docked in this embodiment.

Figure 24:
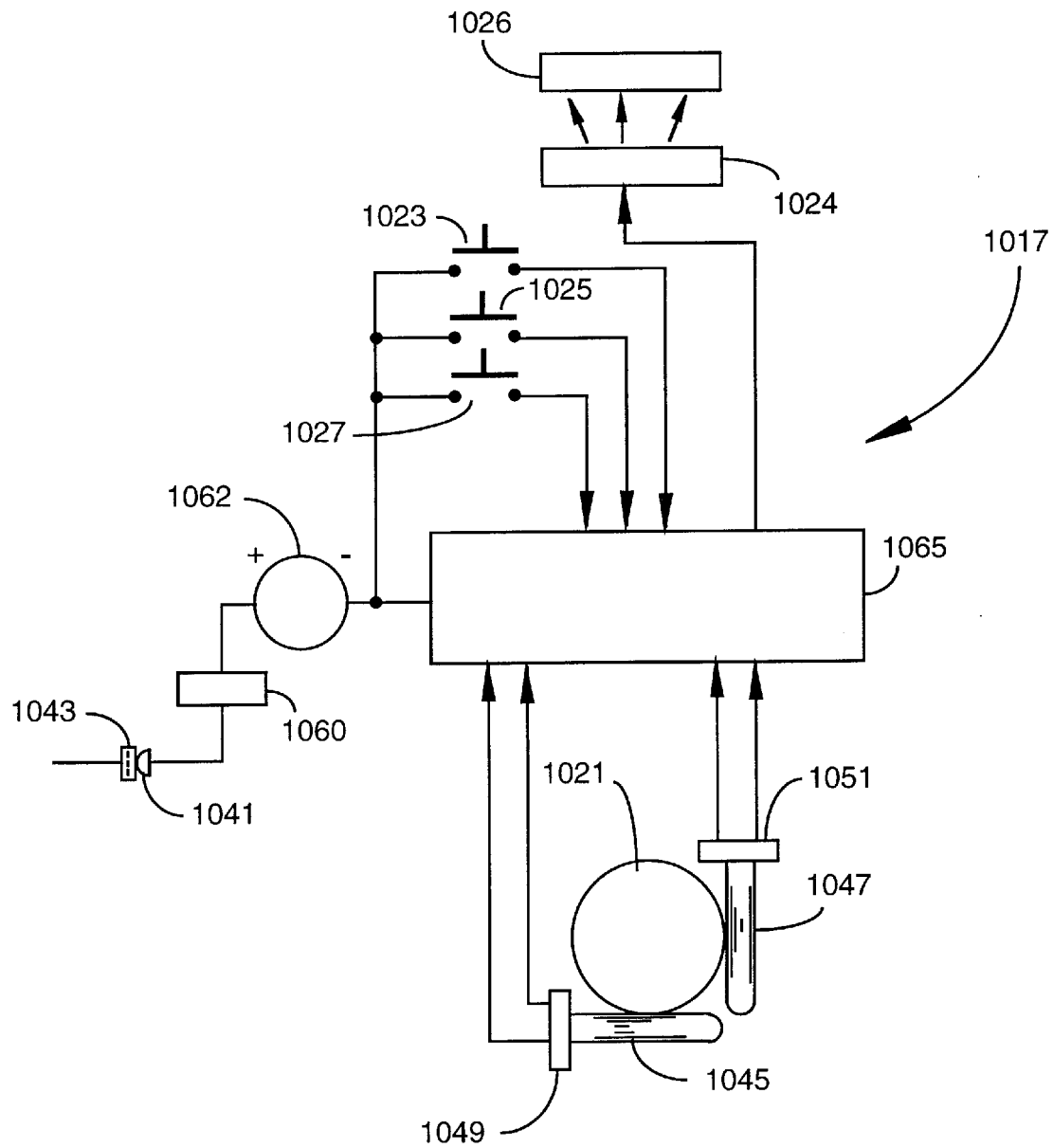
FIG. 24 is a mostly diagrammatic representation of internal components of the removable pointer device of FIGS. 22H, 22I and 23.

FIG. 24 is a mostly diagrammatic representation of the internal components of removable pointer device 1017 for the embodiment described for FIGS. 22A–I and 23. Two rollers, 1045 and 1047, are mounted at right angles and bear against trackball 1021. As trackball 1021 rotates, roller 1045 responds to movements in a first direction and roller 1047 senses movements at 90° to the first direction. The rollers are connected to encoder wheels 1049 and 1051, which transmit signals relative to movement to controller 1065.

Removable pointer device 1017 is powered by a battery 1062 that is rechargeable in this embodiment by charger circuit 1060 when the pointer device is seated in well 1016. Battery charger 1060 receives electrical current from the computer host through a spring-loaded contact base, or any other suitable type of charging contact. In this embodiment a spring wiper contact 1043 is located on one side of the well and a fixed contact 1041 is on the side of the pointer. Contacts are well known in the art and there are many equivalent ways that such a contact can be configured. For example, in other embodiments there may be a female connector on the bottom of the pointer device that plugs into a male connector in the bottom of the host well. Such an arrangement not only serves as an electrical contact, but also holds the pointer device in the well, minimizing or eliminating the need for detents. Signals produced from the trackball's motion are converted to infrared signals by microprocessor-based controller 1065 and output through LED transmitter 1024 to photodiode receiver 1026 in the well wall, or if the pointer is being used outside the well, photo diode receiver 1033 on the front side of the housing as shown in FIG. 22. Input signals from control buttons 1023, 1025, and 1027 are also processed by controller 1065.

Figure 25:
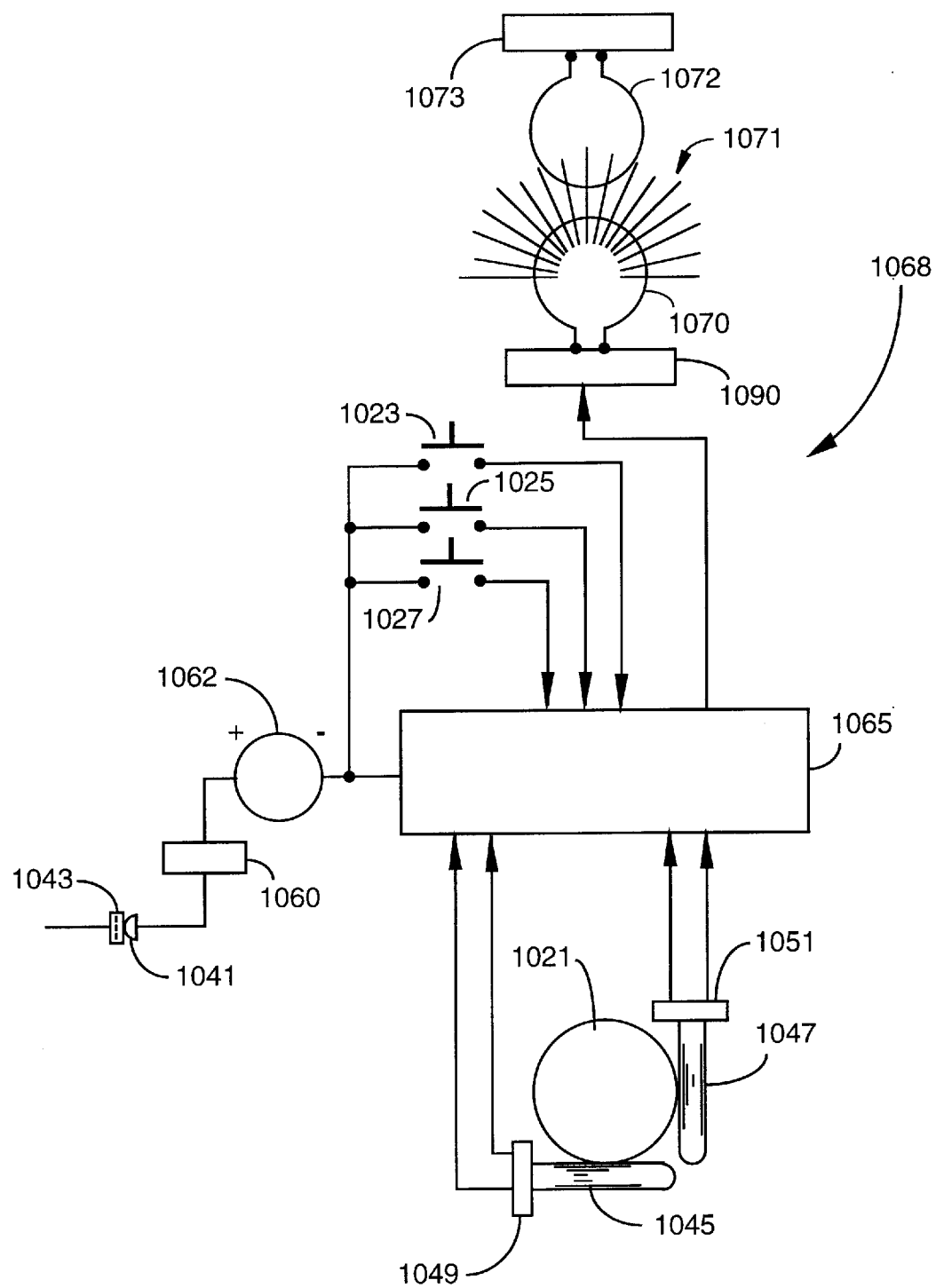
FIG. 25 is a mostly diagrammatic representation of internal components of a removable pointer device according to an alternative embodiment of the present invention.

FIG. 25 is a mostly diagrammatic representation of the internal components of a cordless removable pointer device 1068 in an alternative embodiment that uses magnetic induction as the medium of communication between pointer device and host. All electromechanical components in FIG. 25 are the same as those described for the FIG. 24 configuration except electrical signals from the encoders and control buttons are input by a microprocessor-based current controller 1090, which passes the current through a one-turn generator loop 1070, creating a magnetic field represented by exemplary field lines 1071. Receiving loop 1072, which is located in the host housing, transmits a magnetically induced current to a demodulator 1073, which forwards the coded signal to a controller.

There are a number of equivalent ways a receiving apparatus may be configured for reception by magnetic induction. For example, such an apparatus might be built into the case of the host computer, or implemented on an add-on printed circuit board. Also, FIG. 25 is largely diagrammatical, as stated above, and the transmission and receptor loops are not drawn to actual size relative to other components. In general, both loops are much larger than shown, and there may be more than a single turn in some embodiments.

In another embodiment of the invention, a cordless unit is provided having both stationary and portable mode features as described above relative to FIG. 22, and configured to operate both as a trackball and a mouse device. In this embodiment one side of the combined removable pointer device is a typical trackball unit and when the device is turned over, it may be used as a mouse. Operating mode is selected by a switch on the side of the device.

Figure 26A:
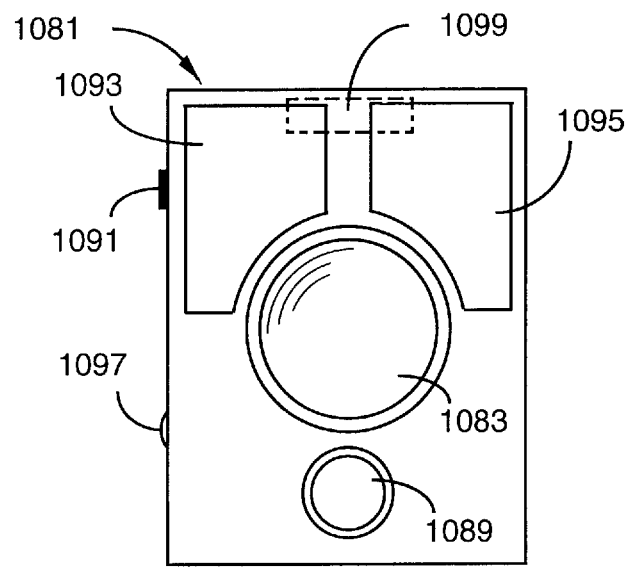
FIG. 26A is a plan view of a combined removable pointer device according to an alternative embodiment of the present invention.

FIG. 26A is a plan view of a combined removable pointer device 1081. Pointer device 1081 comprises on the surface shown in FIG. 26A all the elements described for a trackball unit in the embodiment of FIGS. 22A–I and 23, with the addition of an operating mode switch 1091 on one side. The user moves switch 1091 to select between trackball and mouse operation. Trackball 1083, control buttons 1093, 1095, and 1089, LED transmitter 1099, and charging intact 1097 are located in the same positions as are their counterparts in the removable trackball of FIGS. 22A–I and 23.

Figure 26B:
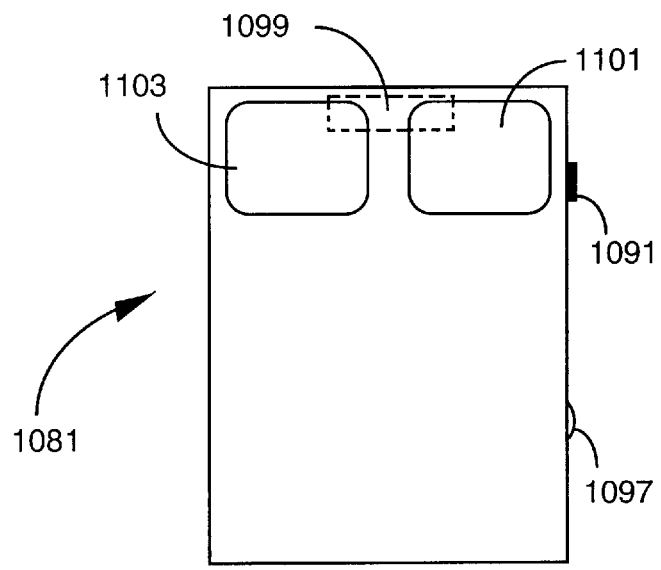
FIG. 26B is a plan view of the pointer device of FIG. 26A, showing the oppoe side.

FIG. 26B is a plan view of the opposite side of combined removable pointer device 108 1. In this embodiment, control buttons 1101 and 1103 are flush with the outside surface of the body of the pointer device, so when used as a trackball, the device can sit squarely on a desktop surface or in its well. In a conventional trackball device, the rotator ball is not loosely mounted like that on a mouse so the ball does not naturally fall to the desktop surface when the unit is inverted. This problem is solved in the present embodiment by the relationship between the height of protrusion of the three pushbuttons on the side of trackball 1021, and the height of protrusion of the trackball.

Figure 26C:
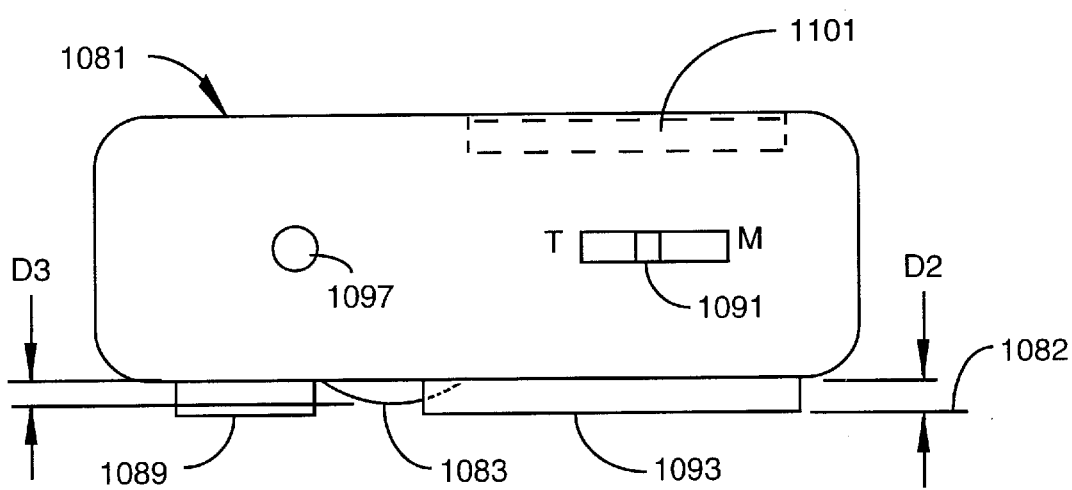
FIG. 26C is an elevation view of a combined removable pointer device according to an alternative embodiment of the present invention.

FIG. 26C shows combination pointer device 1081 in contact with a flat surface 1082. Dimension D2 from the casing to the outer surface of any of the control buttons is greater than dimension D3 from the unit casing to the trackball. Slight pressure exerted on the unit causes spring-loaded control buttons 1089, 1093, and 1095 to depress bringing ball 1083 into contact with surface 1082, so lateral movement will cause the ball to rotate.

The phenomenon of riding on the spring-loaded buttons provides a new aspect of control in operating the pointer device as a mouse. For example, in the often-occurring situation with a mouse where surface area available for mouse operations is limited, the mouse often has to be picked up and repositioned on the operating surface. Picking up the mouse so the ball does not touch the operating surface insures that position signals are not transmitted while the mouse is repositioned. With a mouse according to this embodiment of the present invention, the mouse can be repositioned simply by relaxing the slight downward pressure necessary to cause the ball to contact the operating surface. This seems at first encounter to be a small difference, but translates to considerable advantage, especially in situations where the available operating surface is severely limited.

Figure 26D:
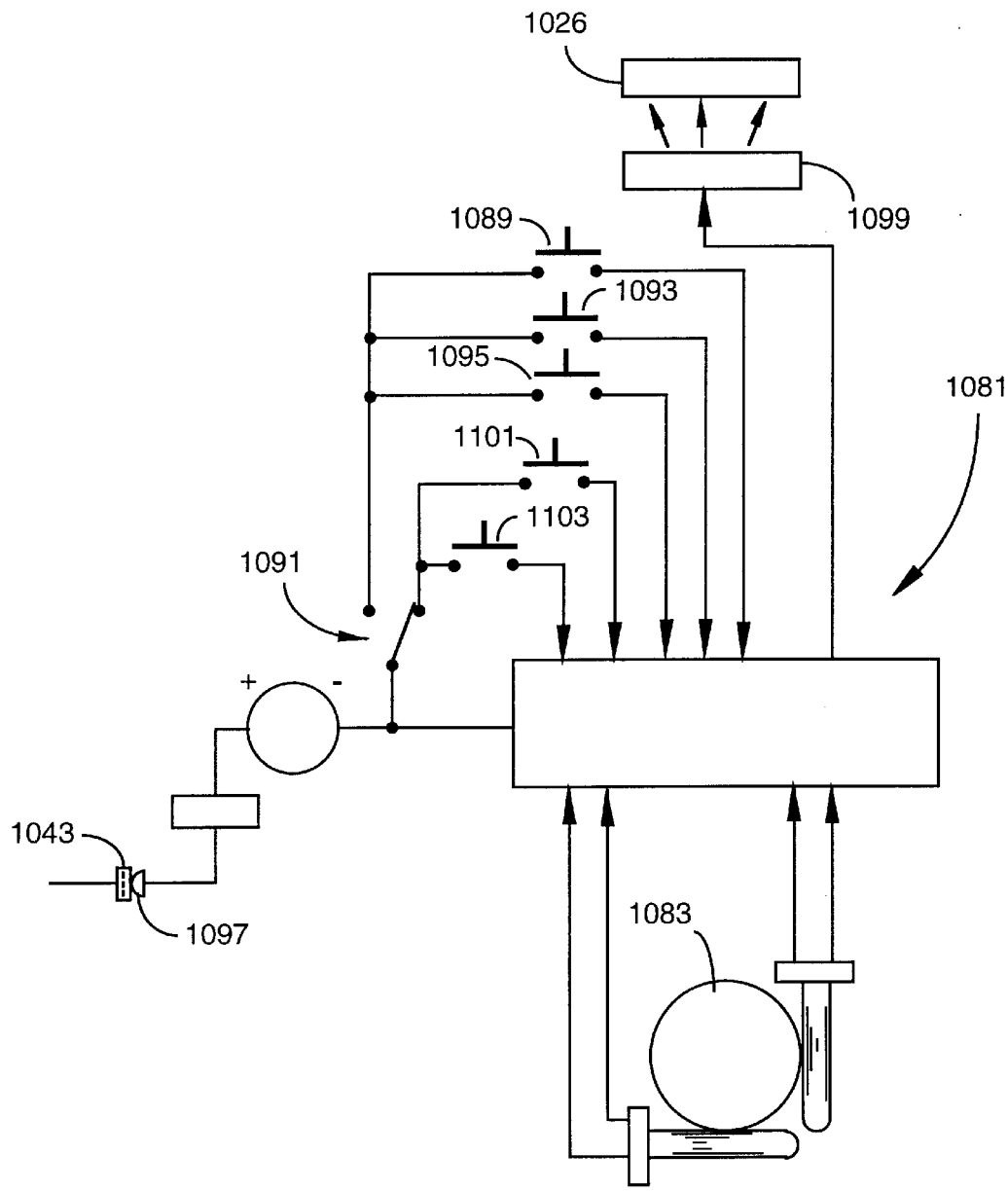
FIG. 26D is a mostly diagrammatic representation of the internal components of the combined removable pointer device of FIG. 26C.

FIG. 26D is a mostly diagrammatic view of the internal components of combined removable device 1081. Internally the trackball and mouse input components share circuitry as shown for the removable pointer device embodiment in FIG. 24, with the addition of operating mode switch 1091 and control buttons 1101 and 1103.

In alternative embodiments, either a removable trackball device or a combined trackball-mouse device as described above may be connected to the host unit by a power cable. There are many ways a cable connection might be implemented for using such devices while removed from the well on the host. For example, at some point on the case of the host computer a small bay may have a cable electrically connected to the host bus and the cable wound on a small reel with a connector on the outward end for connecting to the pointer device when removed from the well. There are many equivalent ways a cable connection might be implemented.

Figure 27A:
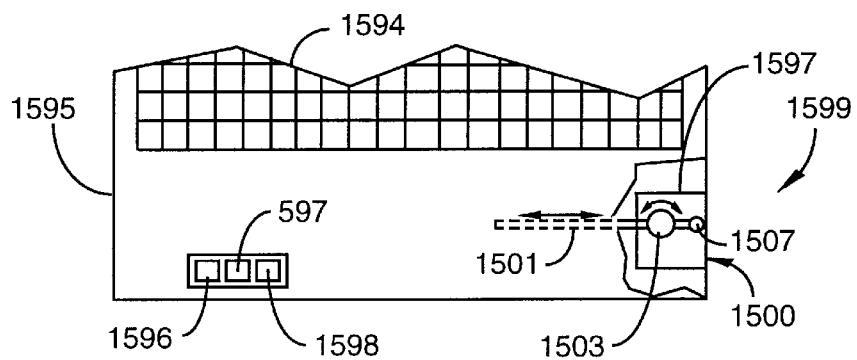
FIG. 27A is a plan view of a polar-coordinate pointer device stored in a compartment in a host computer according to an alternative embodiment of the present invention.

In an alternative embodiment, a pointer device sends polar coordinate location signals in response to movements made by a mechanically attached, extendable positional input bar. FIG. 27A is a plan view of such a polar coordinate pointer device 1599 stored in unextended form inside a compartment 1597 in host housing 1595. Positioned input bar 1501, which passes through a sensored pivot 1503, can be extended from opening 1500 by the user pulling handle 1507. A preferred location for the device for a right-handed person is on the right side of the housing that contains keyboard 1594, but it could be located in any other place as well, such as on the left side for left-handed users. Operational control buttons 1596, 1597, and 1598 of the type typically used to control discrete pointer signalling, are located in another area of housing 1595 in this embodiment, such as on the left front side.

Figure 27B:
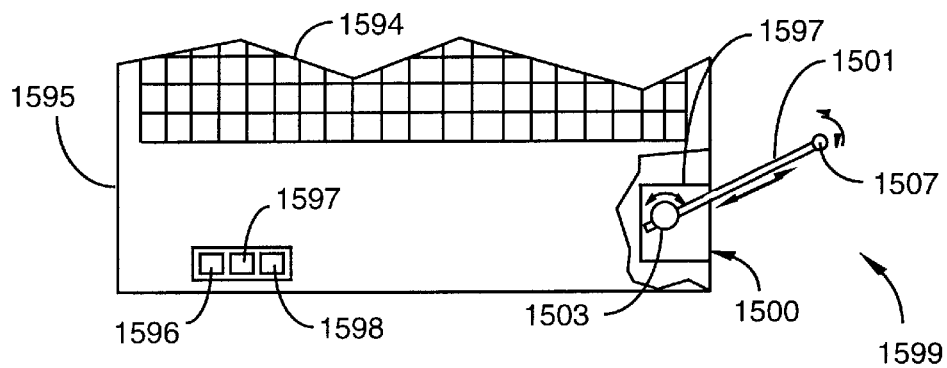
FIG. 27B is a plan view of the polar-coordinate pointer device of FIG. 27A with the pointer device extended for use.

FIG. 27B is a plan view of polar coordinate pointer device 1599 in extended operating position. Positional input bar 1501 can be held by handle 1507 and freely moved in a horizontal plane over an area adjacent to the computer housing. A stop near the inboard end of positional input bar 1501 limits the maximum distance the bar can be extended. On the outboard end of positional input bar 1501, a pivoted handle 1507 is attached by a vertical pin. Such a handle could have any of a number of different shapes.

In one embodiment, grooved channels (not shown) along the length of the input bar engage mating guides in the pivot to prevent rotation of the bar around the longitudinal axis. There are a number of equivalent ways the engagement and guiding function may be accomplished.

Sensors at pivot 1503 (not shown), track radial displacement of positional input bar 1501. Other sensors (not shown) track rotation of the pivot mechanism, which is the angular displacement of positional input bar 1501. There are a number of types and arrangements of bar guides and sensors that would be suitable. Sensor information is transformed from polar coordinates to cartesian coordinates, and used as pointer input in the same fashion that trackball or mouse positional input is used. Input from control buttons 11596, 1597, and 1598 in FIG. 27A, is interpreted just as control button input from a trackball or mouse device.

Figure 27C:
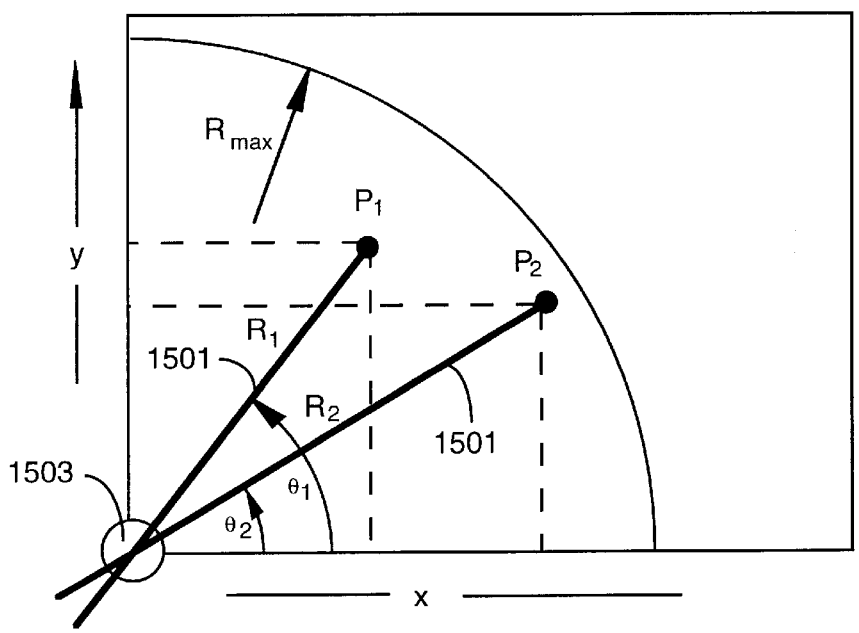
FIG. 27C is a graphic illustration of the geometry involved in the calculation of the cartesian of the polar-coordinate pointer device in FIG. 27B.

FIG. 27C is a graphic illustration of the geometry involved in the transformation of displacement measurements of positional input bar 1501 from R, Θ polar coordinates to x,y rectangular coordinates that can be used for screen cursor output. In FIG. 27C, points $P_1$ and $P_2$ represent two x,y positions of pivoted handle 1507 on positional input bar 1502 measured from pivot 1503 at $P_0$. Point $P_1$ is at radial distance $R_1$ and angle $\Theta_1$ from $P_0$; point $P_2$ is at radial distance $R_2$ and angle $\Theta_2$ from $P_0$. The maximum radial distance, $R_{max}$, the bar can be displaced is shown as a circular arc. Through transformation equations, $x = R \cos \Theta$ and $y = R \sin \Theta$, x,y positions of both $P_1$ and $P_2$ points can be calculated.

There are a number of variations to the pointer described with reference to FIGS. 27A, 27B, and 27C. For example, the pivot mechanism, bar, and handle could all be a part of a mechanism dockable in the computer case, and removable as a unit to be placed external to the computer and operated. In this alternative, the removable unit could be connected to the host by a cable, or could communicate by infra-red or inductive techniques.

Figure 28B:
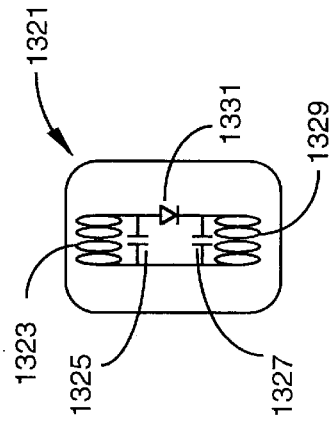
FIG. 28B is a plan view of the broadcast pointer device of FIG. 28A with the deployable element deployed.
Figure 28D:
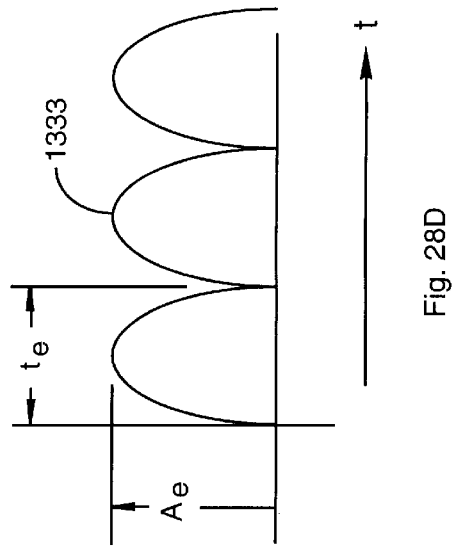
FIG. 28D is an illustration of an waveform as received by the antenna from the pointer in FIGS. 28A, B and C.
Figure 28A:
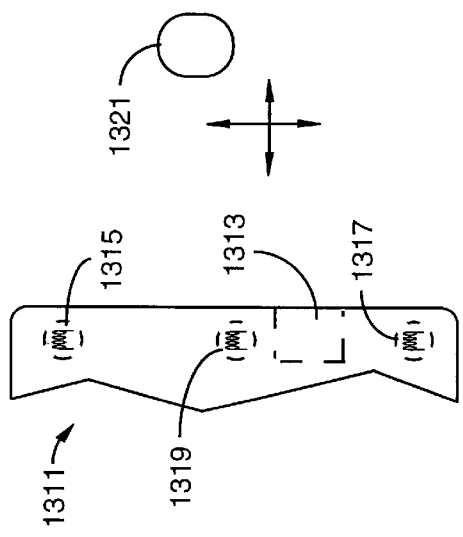
FIG. 28A is a plan view of a broadcast pointer system with a deployable element and a storage compartment according to an alternative embodiment of the present invention.

FIG. 28A is a plan view of yet another alternative embodiment of the present invention, wherein a removable, cordless, pointer receives broadcast signals from multiple antennas in or on the host, and echoes the signals to a receiver in the host in a manner that allows control circuitry to track the position of the moving pointer. The tracked position of the movable pointer is used in the manner that pointer input from other types of pointers is used.

FIG. 28A shows one edge of a body 1311 of a host computer, having a storage compartment 1313 and three antennas 1315, 1317, and 1319. A movable pointer device 1321 is storable in a compartment 1313 when not in use, and may be removed and deployed, as shown in FIG. 28A, for use.

FIG. 28B is a schematic of internal elements of device 1321, showing a rectifier circuit of two antennas 1323 and 1329 connected with capacitors 1325 and 1327, and a diode 1331. In operation in this particular embodiment, antennas 1315 and 1317 in the host are sending antennas, and antenna 1319 in the host is a receiving antenna.

In one mode of operation, a carrier wave of a common frequency and amplitude is broadcast by each of sending antennas 1315 and 1317, but the signals are broadcast at a pre-programmed phase shift. The rectifier circuit in the pointer device intercepts the broadcast signals, combines (sums) them, and echoes a rectified waveform having a frequency known in the radio arts as the Hull frequency. This signal is received at antenna 1319, where connected circuitry analyzes the signal to determine the position of the pointer relative to the broadcast and receiving antennas.

The receiving antenna intercepts both the original broadcast signals as well as the echoed signal, but the broadcast signals are at a much higher and known frequency than the echoed signal, and are filtered. FIG. 28D is a simplified illustration of an echoed signal 1333 at receiving antenna 1319.

Echoed signal 1333 exhibits an amplitude $A_e$ and a frequency $(1/t_c)$ that are indicative of the position of the pointer device. The amplitude is a function of the ratio of the distances to the pointer from each of the sending antennas, providing a locus, and the position on the locus is fixed by the frequency. The radio principles to relied upon for the broadcast cursor are well known in the radio arts, and are no more detailed explanation is presented here.

The information contained in the echoed signal is sufficient to locate the position of the pointer device near the host in essentially real time, and circuitry to provide this information to the host computing elements in a manner to control a display cursor and the like, is well known.

Figure 28C:
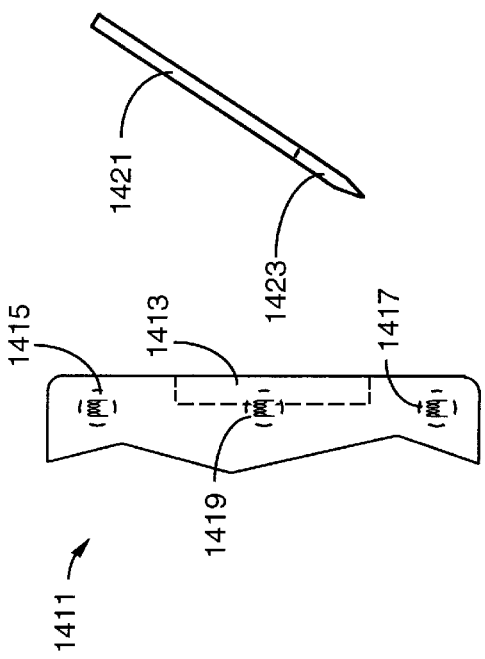
FIG. 28C is a plan view of another broadcast pointer system with a stylus-type deployable element.

FIG. 28C shows a broadcast pointer system comprising a host 1411, and three antennas 1415, 1417, and 1419, similar to that shown in FIG. 28A, wherein a stylus 1421 is employed rather than a mouse-type pointer. In this embodiment the rectifier circuitry shown in FIG. 28B is implemented in a region 1423 near the point of the stylus. The stylus embodment operates in the same manner as does the mouse-type pointer described above, except the holding and manipulating of the pointer is in the manner of wielding a pen or a pencil, rather than a mouse. This embodiment provides a convenient way to input cursive writing and printing to the host computer. With appropriate circuitry monitoring and interpreting stylus movement, one may duplicate the functions of a pen-based input system. When not in use, stylus 1421 resides in a compartment 1413 in the host.

Removable pointer devices according to various embodiments of the present invention are particularly applicable to notebook and subnotebook computers. Such devices are not limited to portable computers, however. A removable pointer device as described in the several embodiments above may also be implemented in a keyboard usable with a host computer, such as a desktop or workstation computer, including terminals designed to be used as nodes on a network.

FIG. 29 is an isometric view of a keyboard 1211 having a removable pointer device 1213 according to an the embodiment of the invention described above with reference to FIGS. 22A and 22B. Keyboard 1211 in this embodiment has a cable 1215 for attaching to a host, and communicating both keystroke and pointer data to the host, but may also be implemented with a keyboard that communicates in another manner with the host, such as by infrared signals or by inductance coupling.

In various embodiments of keyboards any and all of the embodiments described above relative to a host notebook-type computer may be implemented. In the case of a keyboard, it is usual to have a keyboard controller for coding keystroke data and imparting the data to the host. In the case of a removable pointer device in a keyboard, the pointer movement data is received by the keyboard controller and coded and passed to the host along with (multiplexed with) the keystroke data.

It will be evident to one with skill in the art that there are many changes that might be made without departing from the spirit and scope of the invention. Many of these alternatives have been described above. For example, there may be more than the four module bays described, or fewer. There may also be more than one planar array of module bays. To provide more docking bays in a compact arrangement, one might provide two or more planar levels, with multiple docking bays in each plane. Similarly, there are many ways modules may be built to be docked in a framework such as computer 11, 221 and 400 to form a planar array. There are similarly many different kinds of connectors that might be utilized as well as many kinds of compressed buses that can be used. There are many kinds of modules that may be provided, and many other changes that might be made within the spirit and scope of the invention.

In addition, different embodiments of pointer devices disclosed can be rendered in different shapes and sizes, and there are many ways known for providing the needed electrical connections and for transmitting signals.

What is claimed is:

1. A modular computer comprising:
   a flat, rectangular case;
   a plurality of module bays arranged in a common plane and opening to one or more edges of the case;
   a multi-pin electrical connector at the inboard end of each module bay for engaging a mating electrical connector of a functional module;
   an internal bus connected to each of the electrical connectors in the module bays;
   a flat-panel display pivotally attached to the case of the modular computer;
   an input apparatus connected to the case;
   a compartment in the case adapted for enclosing a removable pointer device;
   a pointer device having a user interface for providing positional input and adapted for storing in the compartment; and
   a communication system coupling the pointer device to the computer, configured to pass positional input from the pointer device to the computer.

2. A modular computer as in claim 1 wherein the flat-panel display is positionable substantially in the plane of the case for storage and transport, and positionable at an angle to the case for viewing in operation.

3. A modular computer as in claim 1 wherein the input apparatus is a physical keyboard.

4. A modular computer as in claim 1 wherein the internal bus is a compressed bus for multiplexing data and addresses on a common set of parallel conductors.

5. A modular computer as in claim 1 wherein the input apparatus is a keyboard, the display is a flat panel display pivotally attached to the case, and the display is adapted to be closed over the keyboard for storage and transport.

6. A modular computer as in claim 1 additionally comprising a power-conversion apparatus for accepting electrical power from one or more of function modules and a power plug, altering the voltage level of the accepted electrical power, and providing the altered voltage to the internal bus for distribution to the multi-pin electrical connectors in the module bays.

7. A modular computer as in claim 1 wherein the module bays open to two opposite edges of the case, and the internal bus is implemented in a central spine between the inboard ends of opposite module bays.

8. A modular computer as in claim 1 further comprising a CPU function module configured to dock in one of the module bays, the CPU function module having a CPU microprocessor and a state translator for managing communication between the CPU microprocessor and the communication bus.

9. A modular computer as in claim 1 comprising a power module configured to dock in one of the module bays, the power module having an electrical power storage unit connected to a mating electrical connector configured to mate with the multi-pin electrical connectors in the module bays.

10. A modular computer as in claim 1 further comprising an I/O function module for performing an I/O function for the modular computer.

11. A modular computer as in claim 10 wherein the I/O function module is a floppy disk drive module.

12. A modular computer as in claim 10 wherein the I/O function module is a hard disk drive module.

13. A modular computer as in claim 10 wherein the I/O function module is a RAM memory module.

14. A modular computer as in claim 10 wherein the I/O function module is a LAN module for providing communication between the modular computer and other digital systems on a local area network.

15. A modular computer as in claim 10 wherein the I/O function module is a modem module for providing serial communication between the modular computer and other digital systems.

16. A modular computer as in claim 10 wherein the I/O function module is a facsimile module for providing facsimile communication over a telephone line.

17. A modular computer as in claim 10 wherein the I/O function module is a specialty module for data acquisition from an instrument, the function module configured to transfer commands to the instrument over a communication link and to receive data from the instrument.

18. A modular computer as in claim 1 wherein the pointer device is a mouse device.

19. A modular computer as in claim 18 wherein the mouse device is connectable to the computer by a cable for communication of positional input with the mouse device deployed from the compartment for use.

20. A general-purpose computer as in claim 18 wherein the communication system comprises an infra-red transmitter in the mouse device for sending positional input and an infra-red receiver in the computer for receiving positional input.

21. A general-purpose computer as in claim 18 wherein the communication system comprises a magnetic field generator in the mouse device unit and an inductive receiver in the notebook computer configured for receiving code representing positional input from the mouse device.

22. A general-purpose computer as in claim 1 wherein the pointer device is a trackball unit.

23. A general-purpose computer as in claim 22 wherein the trackball unit is connectable to the computer by a cable for communication of positional input with the mouse device deployed from the compartment for use.

24. A general-purpose computer as in claim 22 wherein the communication system comprises an infra-red transmitter in the trackball unit for sending positional input and an infra-red receiver in the computer for receiving positional input.

25. A general-purpose computer as in claim 22 wherein the communication system comprises a magnetic field generator in the trackball unit and an inductive receiver in the notebook computer configured for receiving code representing positional input from the trackball unit.

26. A general-purpose computer as in claim 1 wherein the pointer device is a trackball unit for which the user interface is a ball presented to be manipulated by the user directly, and the compartment is provided in the surface of the housing to which the keyboard is mounted, such that the ball is accessible to the user with the trackball unit in the compartment, as well as with the trackball unit removed from the compartment.

27. A general-purpose computer as in claim 26 wherein the communication system comprises an infra-red transmitter in the trackball unit, a first infra-red receiver in the compartment for receiving code with the trackball unit in the compartment, and a second infra-red receiver mounted in a surface of the computer for receiving code with the trackball removed from and positioned outside the compartment.

28. A general-purpose computer as in claim 26 wherein the communication system comprises an infra-red transmitter in the trackball unit, an infra-red receiver mounted in surface of the computer for receiving code with the trackball removed from and positioned outside the compartment, a multi-pin connector on the trackball unit, and a mating connector in a wall of the compartment placed to engage the multi-pin connector with the trackball in the compartment, the trackball unit configured to pass positional input to the computer through the multi-pin connector with the trackball unit in the compartment.

29. A general-purpose computer as in claim 26 wherein the communication system comprises a magnetic field generator in the trackball unit and an inductive receiver in the notebook computer configured for receiving code representing positional input from the trackball unit.

30. A general-purpose computer as in claim 26 wherein the communication system comprises a magnetic field generator in the trackball unit, an inductive receiver in the computer for receiving code with the trackball removed from and positioned outside the compartment, a multi-pin connector on the trackball unit, and a mating connector in a wall of the compartment placed to engage the multi-pin connector with the trackball in the compartment, the trackball unit configured to pass positional input to the computer through the multi-pin connector with the trackball unit in the compartment.

31. A general-purpose computer as in claim 1 wherein the communication system comprises:

a pair of broadcast antenna in the housing configured to broadcast a carrier waveform at a common frequency but at a known phase difference;

a rectifier circuit in the pointer device comprising two antenna connected through a diode;

a receiving antenna in the housing configured to receive an echo of the summed waveforms broadcast by the pair of broadcast antennas; and circuitry in the computer housing connected to the receiving antenna and configured for analyzing the received waveform and determining the position of the pointer from waveform characteristics.

32. A general-purpose computer as in claim 31 wherein the pointer device is a stylus, and the rectifier circuit is positioned in the nose region of the stylus.

* * * * *